US012563910B2

(12) United States Patent
Bao et al.

(10) Patent No.: US 12,563,910 B2
(45) Date of Patent: Feb. 24, 2026

(54) DISPLAY SUBSTRATE AND DISPLAY DEVICE

(71) Applicants:Chengdu BOE Optoelectronics Technology Co., Ltd., Chengdu (CN); BOE TECHNOLOGY GROUP CO., LTD., Beijing (CN)

(72) Inventors: Jiandong Bao, Beijing (CN); Yunhao Wang, Beijing (CN); Peng Hou, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/289,044

(22) PCT Filed: May 31, 2022

(86) PCT No.: PCT/CN2022/096141
§ 371 (c)(1),
(2) Date: Oct. 31, 2023

(87) PCT Pub. No.: WO2023/230811
PCT Pub. Date: Dec. 7, 2023

(65) Prior Publication Data
US 2025/0098424 A1      Mar. 20, 2025

(51) Int. Cl.
*H10K 59/122*        (2023.01)
*G06F 3/041*         (2006.01)
(Continued)

(52) U.S. Cl.
CPC ......... *H10K 59/122* (2023.02); *G06F 3/0412* (2013.01); *G09G 3/3233* (2013.01);
(Continued)

(58) Field of Classification Search
CPC ............. H10K 59/122; H10K 59/8792; G09G 3/3233; G09G 2300/0426;
(Continued)

(56) References Cited

U.S. PATENT DOCUMENTS 10,847,083 B1 * 11/2020 Pan ..................... H01L 25/0753
11,374,030 B2     6/2022 Zhang
(Continued)

FOREIGN PATENT DOCUMENTS

CN            106848095 A      6/2017
CN            107680496 A      2/2018
(Continued)

OTHER PUBLICATIONS

International Search Report in PCT/CN2022/096141 in Chinese dated Feb. 11, 2023 with English translation.
(Continued)

*Primary Examiner* — Ariel A Balaoing
(74) *Attorney, Agent, or Firm* — Collard & Roe, P.C.

(57) ABSTRACT
A display substrate and a display device, the display substrate has a plurality of sub-pixels, and includes a base substrate, a pixel driving circuit layer, a pixel definition layer and a spacer layer. The pixel driving circuit layer is disposed on the base substrate, the pixel definition layer is disposed on a side of the pixel driving circuit layer away from the base substrate, and includes a plurality of sub-pixel openings, wherein each of the plurality of sub-pixels includes a pixel driving circuit disposed in the pixel driving circuit layer and a light-emitting device at least partially disposed in the sub-pixel opening, the spacer layer is disposed on a side of the pixel definition layer away from the base substrate, and includes a plurality of spacers, wherein a transmittance of the plurality of spacers is less than 5%.

19 Claims, 17 Drawing Sheets

(51) Int. Cl.
    *G09G 3/3233*        (2016.01)
    *H10K 59/80*         (2023.01)
(52) U.S. Cl.
    CPC . *H10K 59/8792* (2023.02); *G09G 2300/0426*
        (2013.01); *G09G 2300/0819* (2013.01); *G09G*
            *2300/0842* (2013.01); *G09G 2300/0861*
        (2013.01); *G09G 2310/08* (2013.01); *G09G*
        *2320/0233* (2013.01); *G09G 2320/0247*
            (2013.01); *G09G 2354/00* (2013.01)
(58) Field of Classification Search
    CPC ... G09G 2300/0819; G09G 2300/0842; G09G
            2300/0861; G09G 2310/09; G09G
            2320/0233; G09G 2320/0247; G06F
                                        3/0412
    See application file for complete search history.

(56)                References Cited

U.S. PATENT DOCUMENTS

| | | | |
|---|---|---|---|
| 11,864,416 | B2 | 1/2024 | Lee et al. |
| 11,871,621 | B2 | 1/2024 | Choi et al. |
| 11,882,726 | B2 * | 1/2024 | Gao .................. G06V 40/1318 |
| 12,223,751 | B2 * | 2/2025 | Li ........................... G06V 20/69 |
| 2011/0168985 | A1 * | 7/2011 | Kwon .................. H10K 59/122 438/34 |
| 2015/0102320 | A1 * | 4/2015 | Jung .................. H10K 50/8428 257/40 |
| 2015/0261050 | A1 | 9/2015 | Chen et al. |
| 2015/0379921 | A1 * | 12/2015 | Lee ...................... G09G 3/3208 345/82 |
| 2018/0151635 | A1 * | 5/2018 | Cao ........................ H10K 71/00 |
| 2019/0058153 | A1 * | 2/2019 | Luo ........................ H10K 71/50 |
| 2019/0214601 | A1 * | 7/2019 | Park ..................... H10K 59/121 |
| 2021/0064213 | A1 * | 3/2021 | Yang ..................... G06F 3/0412 |
| 2021/0146718 | A1 * | 5/2021 | Zhang .................. H10H 29/142 |
| 2021/0151524 | A1 * | 5/2021 | Tang ..................... H10K 59/65 |
| 2022/0037405 | A1 * | 2/2022 | Ren ...................... H10K 59/125 |
| 2022/0093690 | A1 * | 3/2022 | Wang ................... H10K 50/865 |
| 2022/0140005 | A1 * | 5/2022 | Bouthinon ........... H10F 39/803 |
| 2022/0158136 | A1 | 5/2022 | Yang et al. |
| 2022/0310721 | A1 | 9/2022 | Ma et al. |
| 2022/0351539 | A1 * | 11/2022 | Hai ...................... H10K 59/124 |
| 2022/0367582 | A1 * | 11/2022 | Wang ................... H10K 59/875 |
| 2022/0399423 | A1 | 12/2022 | Du et al. |
| 2024/0128288 | A1 * | 4/2024 | Qin .......................... G01J 1/44 |

FOREIGN PATENT DOCUMENTS

| | | |
|---|---|---|
| CN | 109817676 A | 5/2019 |
| CN | 110504275 A | 11/2019 |
| CN | 110993661 A | 4/2020 |
| CN | 111816784 A | 10/2020 |
| CN | 112420956 A | 2/2021 |
| CN | 112530998 U | 3/2021 |
| CN | 112864205 A | 5/2021 |
| CN | 113690271 A | 11/2021 |
| CN | 113707697 A | 11/2021 |
| CN | 215834530 U | 2/2022 |
| CN | 215834552 U | 2/2022 |
| CN | 114171560 A | 3/2022 |
| WO | 2021102988 A1 | 6/2021 |

OTHER PUBLICATIONS

Written Opinion of the International Searching Authority in PCT/CN2022/096141 in Chinese dated Feb. 11, 2023.
Chinese Office Action in Chinese Application No. 2022800016036 with English translation dated Oct. 30, 2025.

* cited by examiner

CF

EM1

PS

EM

PDL

TFT

130 —

DISPLAY SUBSTRATE AND DISPLAY DEVICE

CROSS REFERENCE TO RELATED APPLICATIONS

This application is a national stage application, filed under 35 U.S.C. § 371, of International Patent Application No. PCT/CN2022/096141, filed on May 31, 2022, the entire disclosure of which is incorporated herein by reference as part of the present application.

TECHNICAL FIELD

The embodiments of the present disclosure relate to a display substrate and a display device.

BACKGROUND

Organic Light Emitting Diode (OLED) display device has a series of advantages such as self-illumination, high contrast, high definition, wide viewing angle, low power consumption, fast response, and low manufacturing cost, and has become one of the key development directions of a new generation of display devices, thus OLED display device has attracted more and more attention. In an OLED display device, the setting mode of the respective structures and the position relationship between the respective structures are important factors that affect the display effect of the display device.

SUMMARY

At least one embodiment of the present disclosure provides a display substrate, the display substrate has a plurality of sub-pixels, and includes a base substrate, a pixel driving circuit layer, a pixel definition layer and a spacer layer. The pixel driving circuit layer is disposed on the base substrate, the pixel definition layer is disposed on a side of the pixel driving circuit layer away from the base substrate, and includes a plurality of sub-pixel openings, wherein each of the plurality of sub-pixels includes a pixel driving circuit disposed in the pixel driving circuit layer and a light-emitting device at least partially disposed in the sub-pixel opening, the spacer layer is disposed on a side of the pixel definition layer away from the base substrate, and includes a plurality of spacers, wherein a transmittance of the plurality of spacers is less than 5%.

For example, in the display substrate provided by at least one embodiment of the disclosure, a transmittance of a portion of the pixel definition layer other than the plurality of sub-pixel openings is less than 5%.

For example, in the display substrate provided by at least one embodiment of the disclosure, a material of the spacer layer is the same as a material of the pixel definition layer.

For example, in the display substrate provided by at least one embodiment of the disclosure, a minimum distance between the plurality of spacers and the plurality of sub-pixel openings is L, and 1 $\mu$m<L<8 $\mu$m.

For example, in the display substrate provided by at least one embodiment of the disclosure, a plane shape of at least a part of the plurality of spacers is rectangle.

For example, in the display substrate provided by at least one embodiment of the disclosure, a length and a width of the rectangle is each in a range of 13 $\mu$m to 19 $\mu$m, in a direction perpendicular to the base substrate, a height of the plurality of spacers is in a range of 0.5 $\mu$m to 2.0 $\mu$m.

For example, in the display substrate provided by at least one embodiment of the disclosure, the pixel driving circuit layer includes a plurality of pixel driving circuits, a plurality of scanning signal lines providing scanning signals for the plurality of pixel driving circuits, and a plurality of reset control signal lines providing reset control signals for the plurality of pixel driving circuits, in a direction parallel to the base substrate, at least parts of the plurality of spacers are respectively located between one reset control signal line and one scanning signal line that is closest to the one reset control signal line.

For example, in the display substrate provided by at least one embodiment of the disclosure, the pixel driving circuit layer includes a plurality of pixel driving circuits, a plurality of scanning signal lines providing scanning signals for the plurality of pixel driving circuits, and a plurality of reset control signal lines providing reset control signals for the plurality of pixel driving circuits, in a direction perpendicular to the base substrate, at least parts of the plurality of spacers are respectively overlapped with at least one of one reset control signal line and one scanning signal line that is closest to the one reset control signal line.

For example, the display substrate provided by at least one embodiment of the disclosure further includes a black matrix layer, disposed on a side of the light-emitting device away from the base substrate, wherein the black matrix layer includes a plurality of first light transmission openings, orthographic projections of the plurality of sub-pixel openings on the base substrate are respectively located within orthographic projections of the plurality of first light transmission openings on the base substrate, and distances between boundaries of the orthographic projections of the plurality of sub-pixel openings on the base substrate and boundaries of the orthographic projections of the plurality of first light transmission openings on the base substrate are in a range of 1.0 $\mu$m to 6.5 $\mu$m.

For example, the display substrate provided by at least one embodiment of the disclosure further includes a plurality of color filters, wherein the plurality of color filters are respectively at least partially disposed in the plurality of first light transmission openings; for one first light transmission opening and one color filter that is at least partially disposed in the one first light transmission opening, an orthographic projection of the one first light transmission opening on the base substrate is located within an orthographic projection of the one color filter on the base substrate.

For example, in the display substrate provided by at least one embodiment of the disclosure, the black matrix layer further includes a plurality of second light transmission openings, and the plurality of second light transmission openings are respectively disposed between two adjacent first light transmission openings among the plurality of first light transmission openings.

For example, the display substrate provided by at least one embodiment of the disclosure further includes a light shielding layer disposed on the base substrate, wherein the pixel driving circuit layer is disposed on a side of the light shielding layer away from the base substrate, and the light shielding layer includes a plurality of third light transmission openings, orthographic projections of at least parts of the plurality of third light transmission openings on the base substrate are respectively at least partially overlapped with orthographic projections of the plurality of second light transmission openings on the base substrate.

For example, in the display substrate provided by at least one embodiment of the disclosure, the orthographic projections of the plurality of third light transmission openings on the base substrate are respectively located within the orthographic projections of the plurality of second light transmission openings on the base substrate.

For example, in the display substrate provided by at least one embodiment of the disclosure, distances respectively between boundaries of the orthographic projections of the at least parts of the plurality of third light transmission openings on the base substrate and boundaries of the orthographic projections of the plurality of second light transmission openings on the base substrate are in a range of 0.5 μm to 1.5 μm.

For example, in the display substrate provided by at least one embodiment of the disclosure, the plurality of sub-pixels include first sub-pixels, second sub-pixels and third sub-pixels, at least part of the plurality of second light transmission openings is located between first light transmission openings corresponding to a first sub-pixel and a third sub-pixel that are adjacent to each other, and a distance between the at least part of the plurality of second light transmission opening and the first light transmission opening corresponding to the first sub-pixel is different from a distance between the at least part of the plurality of second light transmission opening and the first light transmission opening corresponding to the third sub-pixel.

For example, in the display substrate provided by at least one embodiment of the disclosure, the first sub-pixels and the third sub-pixels are arranged in a plurality of rows and a plurality of columns, a plurality of first sub-pixels and a plurality of third sub-pixels in a same column are arranged alternately, and one second light transmission opening is disposed between first light transmission openings corresponding to a first sub-pixel and a third sub-pixel that are adjacent to each other in a same column.

For example, in the display substrate provided by at least one embodiment of the disclosure, one first sub-pixel, two second sub-pixels and one third sub-pixel constitute a repeating unit, and a plurality of repeating units are arranged in an array, a plurality of second sub-pixels in the plurality of repeating units are arranged in a plurality of rows and a plurality of columns, and the one second light transmission opening is also disposed between first light transmission openings corresponding to second sub-pixels that are adjacent in a row direction.

For example, in the display substrate provided by at least one embodiment of the disclosure, an orthographic projection of each of the plurality of spacers on the base substrate is located between orthographic projections of sub-pixel openings of second sub-pixels that are adjacent in a column direction, and is located between orthographic projections of sub-pixel openings of a first sub-pixel and a third sub-pixel that are adjacent in the row direction on the base substrate.

For example, in the display substrate provided by at least one embodiment of the disclosure, a shortest distance between the orthographic projection of each of the plurality of spacers on the base substrate and the orthographic projection of the sub-pixel opening of the first sub-pixel among the first sub-pixel and the third sub-pixel that are adjacent to each other on the base substrate is greater than a shortest distance between the orthographic projection of each of the plurality of spacers on the base substrate and the orthographic projection of the sub-pixel opening of the third sub-pixel among the first sub-pixel and the third sub-pixel that are adjacent to each other on the base substrate.

For example, in the display substrate provided by at least one embodiment of the disclosure, shortest distances between the orthographic projection of each of the plurality of spacers on the base substrate and the orthographic projections of the sub-pixel openings of the second sub-pixels that are adjacent to each other on the base substrate are substantially the same.

For example, in the display substrate provided by at least one embodiment of the disclosure, the first sub-pixels are red sub-pixels, the second sub-pixels are green sub-pixels, and the third sub-pixels are blue sub-pixels.

For example, the display substrate provided by at least one embodiment of the disclosure further includes an encapsulation layer disposed on a side of the light-emitting device away from the base substrate and a touch layer disposed on a side of the encapsulation layer away from the base substrate, wherein the black matrix layer is disposed on a side of the encapsulation layer away from the base substrate, the black matrix layer is disposed on a side of the touch layer away from the base substrate, and the touch layer includes a plurality of touch lines, orthographic projections of the plurality of touch lines on the base substrate are not overlapped with orthographic projections of the plurality of second light transmission openings on the base substrate.

For example, in the display substrate provided by at least one embodiment of the disclosure, the first sub-pixels and the third sub-pixels are arranged in a plurality of rows and a plurality of columns, a plurality of first sub-pixels and a plurality of third sub-pixels in a same column are arranged alternately, wherein at least a part of the plurality of touch lines has a gap between a first sub-pixel and a third sub-pixel that are adjacent in a same column.

For example, in the display substrate provided by at least one embodiment of the disclosure, at least a part of the plurality of touch lines has a gap at a side close to the third sub-pixel or a side close to the first sub-pixel among the first sub-pixel and the third sub-pixel that are adjacent in a same column; or at least a part of the plurality of touch lines has a gap at a side close to the third sub-pixel and a side close to the first sub-pixel among the first sub-pixel and the third sub-pixel that are adjacent in a same column.

At least one embodiment of the disclosure provides display device including the display substrate according to the embodiment of the disclosure.

BRIEF DESCRIPTION OF THE DRAWINGS

In order to clearly illustrate the technical solution of the embodiments of the present disclosure, the drawings of the embodiments will be briefly described below. It is obvious that the described drawings in the following are only related to some embodiments of the present disclosure, but are not a limitation of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure shall have normal meanings understood by those skilled in the art. The words "first", "second" and the like used in the disclosure do not indicate the sequence, the number or the importance, but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The terms "on", "below", "left", "right", etc. are only used to represent relative positional relationships, in the case that the absolute positions of the described objects change, the relative positional relationship may also change accordingly.

Figure 1A:
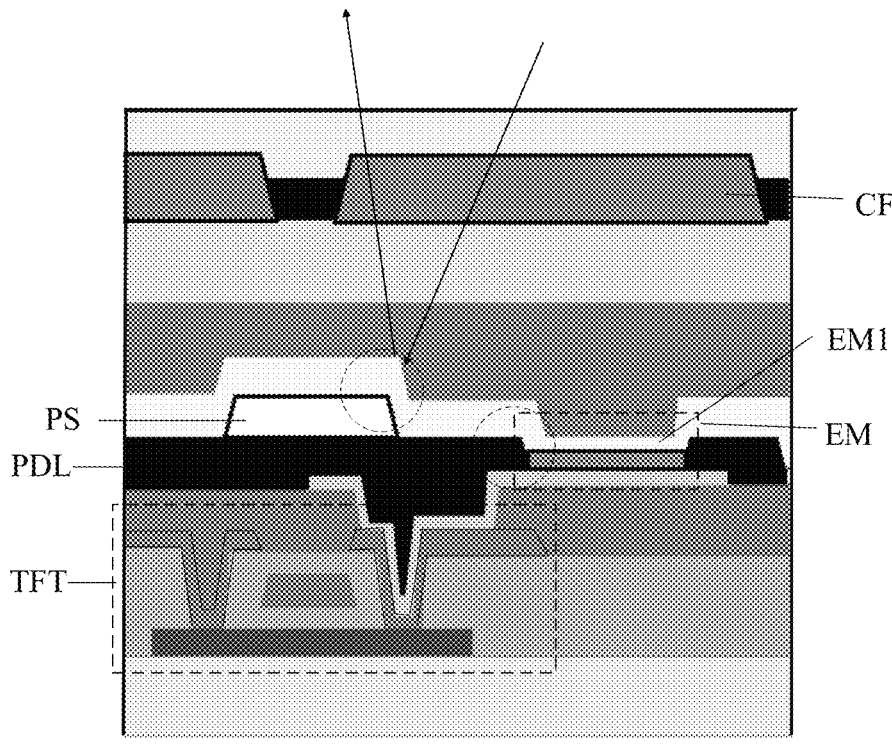
FIG. 1A is a schematic partial sectional view of a display substrate.

FIG. 1A illustrates a schematic sectional view of a display panel. As shown in FIG. 1A, the display panel includes a light-emitting device EM and a pixel driving circuit for driving the light-emitting device. The pixel driving circuit includes a thin film transistor TFT and a storage capacitor. A pixel definition layer PDL is disposed over the pixel driving circuit to define a light-emitting region of the light-emitting device EM, and a spacer PS is disposed over the pixel definition layer PDL, and used to support structures such as a photomask, during a manufacturing process of the display panel, for example. The pixel definition layer PDL and the spacer PS are usually formed of organic insulation materials such as polyimide.

In some embodiments, the display panel further includes a color filter CF, and the light emitted by the light-emitting device EM is emitted through the color filter to form a purer monochromatic light. In some cases, for example, under strong light, the external ambient light may also enter the display panel through the color filter CF and be reflected by some structures in the display panel, for example, reflected at the chamfer part (the part of the circular dashed box in the figure) of the pixel definition layer PDL and the spacer PS, the reflected light will continue to emit from the color filter CF, affect the normal display of the display panel, and make the dark effect of the display panel poor. The visual performance is reflected color separation phenomenon.

Figure 1B:
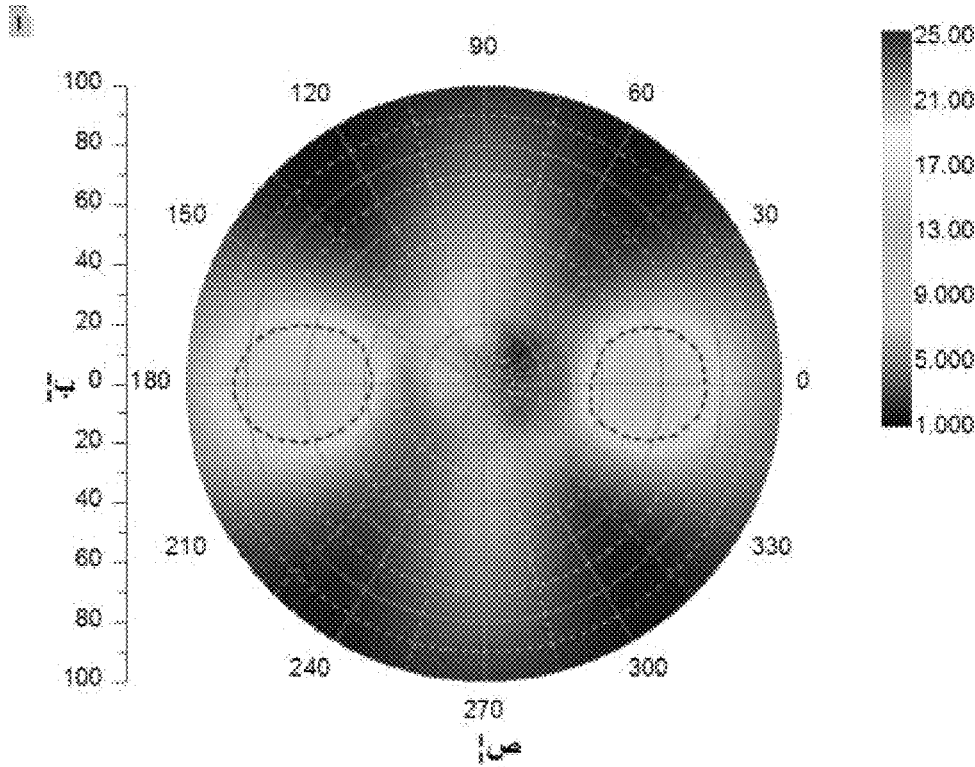
FIG. 1B is a color separation test result diagram of the display substrate in FIG. 1A.

For example, FIG. 1B is a color separation test result view of the display substrate in FIG. 1A. During the test process, a color separation test equipment is used to test the color separation of fitting at 6 points in 72 directions (one step per 5°)(432 points in total) and make a cloud image as shown in FIG. 1B. In a case that the display panel is in a dark state, when a light source illuminates the screen, as shown in FIG. 1B, from dark color to light color, the more serious the color separation, the color separation phenomenon will seriously affect the display effect of the display panel.

At least one embodiment of the present disclosure provides a display substrate and a display device. The display substrate has a plurality of sub-pixels and includes a base substrate, a pixel driving circuit layer, a pixel definition layer and a spacer layer. The pixel driving circuit layer is disposed on the base substrate, and the pixel definition layer is disposed on a side of the pixel driving circuit layer away from the base substrate and includes a plurality of sub-pixel openings. Wherein each of the plurality of sub-pixels includes a pixel driving circuit disposed in the pixel driving circuit layer and a light-emitting device at least partially disposed in the sub-pixel opening. The spacer layer is disposed on a side of the pixel definition layer away from the base substrate and includes a plurality of spacers, wherein the light transmittance of a plurality of spacers is less than 5%.

In the above display substrate provided by the embodiments of the present disclosure, the spacer is basically opaque and will absorb light, so the external ambient light will not be reflected in the display panel and emitted. Therefore, the display panel will not produce color separation and other undesirable phenomena, and has better display effect.

The display substrate and the display device provided by the embodiments of the present disclosure will be described below through several specific embodiments.

Figures 2, 3:
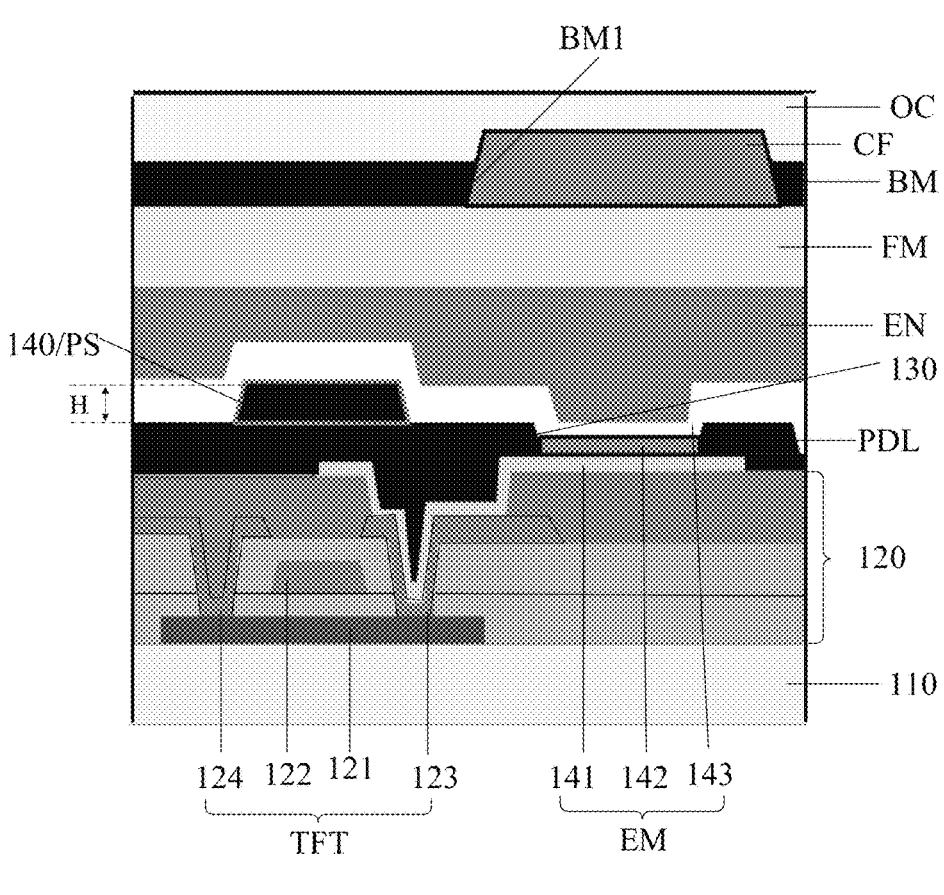
FIG. 2 is a schematic partial sectional view of the display substrate provided by at least one embodiment of the present disclosure.
FIG. 3 is a partial plan view of a black matrix layer being laminated with a spacer layer in a display substrate provided by at least one embodiment of the present disclosure.

At least one embodiment of the present disclosure provides a display substrate. FIG. 2 illustrates a partial sectional view of the display panel, and FIG. 3 illustrates a plan view of a partial structure of the display panel. As shown in FIG. 2 and FIG. 3, the display substrate has a plurality of sub-pixels, and includes a base substrate 110, a pixel driving circuit layer 120, a pixel definition layer PDL, and a spacer layer 140.

The pixel driving circuit layer 120 is disposed on the base substrate 110 and includes a plurality of pixel driving circuits. Each pixel driving circuit includes a thin film transistor TFT and a storage capacitor (not shown) and other structures. For example, Each pixel driving circuit may be formed into a structure such as 3T1C, 4T1C, 5T1C, 5T2C, 6T1C, 7T1C or 8T1C, which will be described in detail later. For example, as shown in FIG. 2, the thin film transistor TFT includes an active layer 121, a gate electrode 122, a first electrode 123, a second electrode 124, and other structures.

The pixel definition layer PDL is disposed on the side of the pixel driving circuit layer 120 away from the base substrate 110 and includes a plurality of sub-pixel openings 130. Each of the plurality of sub-pixels includes a pixel driving circuit disposed in the pixel driving circuit layer 120 and a light-emitting device EM at least partially disposed in the sub-pixel opening 130.

For example, as shown in FIG. 2, the light-emitting device EM includes a first electrode 141, a light-emitting material layer 142, and a second electrode 143. For example, the first electrode 141 serves as an anode and is electrically connected to the source/drain electrode 123 of the thin film transistor TFT. The light-emitting material layer 142 includes an organic light-emitting material which is configured to emit monochromatic light or white light. The second electrode 143 serves as a cathode, for example, formed as a surface electrode, that is, the second electrodes 143 of the plurality of sub-pixels is continuously set as a plane to cover the base substrate 110 as a whole; alternatively, in some embodiments, at the position where the display substrate needs to improve the light transmittance, the second electrode 143 may have a pattern directly opposite to the first electrode 141, that is, the second electrode 143 is patterned to improve the light transmittance of the display substrate at this position.

The spacer layer 140 is disposed on a side of the pixel definition layer PDL away from the base substrate 110 and includes a plurality of spacers PS. The light transmittance of the plurality of spacers PS is less than 5%, for example, less than 2%. The plurality of spacers PS may support devices such as masks during the manufacturing process of the display substrate.

For example, in some embodiments, the plurality of spacers PS may be formed from black opaque materials, such as a black opaque material formed by doping black dye in a resin material, which has a good absorption effect on light. Therefore, when an external ambient light illuminates the spacers PS, the external ambient light will not be reflected but absorbed, so the color separation phenomenon can be further weakened or even eliminated.

For example, in some embodiments, the light transmittance of a part of the pixel definition layer PDL other than the plurality of sub-pixel openings 130 is less than 5%, for example, less than 2%. For example, the material of the pixel definition layer PDL may be the same as that of the plurality of spacers PS, so they may be formed in a same patterning process by using a halftone mask, or the pixel definition layer PDL and the plurality of spacers PS may also be respectively formed by using the same or different materials.

Therefore, in the case where an external ambient light is irradiated on the pixel definition layer PDL, the external ambient light will not be reflected by the pixel definition layer PDL, therefore, the color separation phenomenon can be further weakened or even eliminated.

Figures 4, 5:
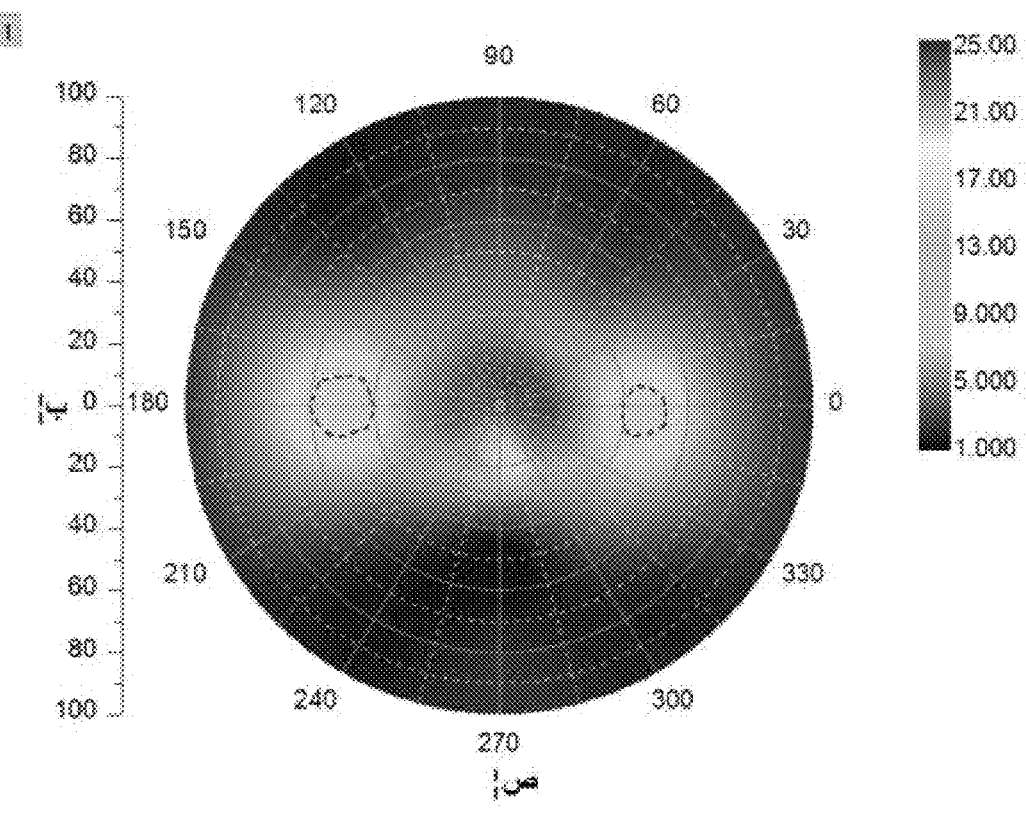
FIG. 4 is a color separation test result diagram of a display substrate provided by at least one embodiment of the present disclosure.
FIG. 5 is a schematic partial plan view of a black matrix layer being laminated with a spacer layer and a first color filter in a display substrate provided by at least one embodiment of the present disclosure.

For example, FIG. 4 is a color separation test result view of the display substrate provided by the embodiment of the present disclosure. As shown in FIG. 4, the color separation phenomenon shown from dark to light colors is greatly weakened compared with that shown in FIG. 1B, and is even not easy to be detected by naked eyes, as such, the display effect of the display panel can be greatly improved. For example, with respect to CIE1976 Lab coordinate system, the color separation effect can achieve the effect of lab<4), $(lab=\sqrt{a^2+b^2})$, axis a represents the red-green relative color, +a represents red, −a represents green, axis b represents the yellow-blue relative color, +b represents yellow, −b represents blue), which can greatly improve the use effect of the display substrate in outdoor sunlight.

For example, in some embodiments, the minimum distance between the plurality of spacers PS and the plurality of sub-pixel openings 130 is L, and 1 μm<L<8 μm. For example, L is 2 μm, 4 μm, 6 μm or 8 μm and so on. Therefore, the plurality of spacers PS are spaced apart from the plurality of sub-pixel openings 130 by certain distances. Since the sidewall of the sub-pixel opening 130 usually has a certain inclination, if the plurality of spacers PS are too close to the plurality of sub-pixel openings 130, the spacers PS may be formed on the sidewalls of the sub-pixel openings 130, thus reducing the height of the spacers PS relative to the base substrate 110, which is difficult to achieve sufficient isolation effect.

For example, in some embodiments, as shown in FIG. 3, the plane shape of at least part of the plurality of spacers PS is rectangle. For example, the size range of the length L1 and the width W1 of the rectangle is 13 μm to 19 μm. For example, the length L1 may be 15 μm, 17 μm or 19 μm, etc., and the width W1 may be 13 μm, 15 μm or 17 μm, etc. In some embodiments, the plane shape of at least part of the spacers PS may also be square, in this case, the side length of the square may be 12 μm, 15 μm, 17 μm or 19 μm, etc.

For example, in some other embodiments, the plane shape of at least part of the plurality of spacers PS may also be circular. In this case, the diameter of the circle may be 13 μm to 19 μm, such as 15 μm or 17 μm, etc.; alternatively, in some other embodiments, the plurality of spacers PS may include main spacer(s) and auxiliary spacer(s), and the plane shape of both the main spacer and the auxiliary spacer may be circular. In this case, the sum of the diameters of the circles of the main spacer and the auxiliary spacer may be 13 μm to 19 μm, such as 15 μm or 17 μm, etc.

For example, as shown in FIG. 1, in the direction perpendicular to the base substrate 110, that is, in the vertical direction in the figure, the height H of the plurality of spacers PS is in a range of 0.5 μm-2.0 μm, such as 1.0 μm or 1.5 μm, etc., so as to fully realize the role of spacers.

For example, as shown in FIG. 2, the display substrate further includes a black matrix layer BM disposed on a side of the light-emitting device EM away from the base substrate 110. The black matrix layer BM includes a plurality of first light transmission openings BM1. FIG. 5 illustrates a plane layout view of the first light transmission openings BM1. As shown in FIG. 5, the orthographic projections of the plurality of sub-pixel openings 130 on the base substrate 110 are respectively located within the orthographic projections of the plurality of first light transmission openings BM1 on the base substrate 110. For example, the distances L2 respectively between the boundaries of the orthographic projections of the plurality of sub-pixel openings 130 on the base substrate 110 and the boundaries of the orthographic projections of the plurality of first light transmission openings BM1 on the base substrate 110 are in a range of 1.0 μm-6.5 μm, for example, 3 μm-6 μm, for example, 3.5 μm, 4 μm, 4.5 μm, 5 μm or 5.5 μm, etc. That is, the first light transmission openings BM1 extend 1.0 μm-6.5 μm outward relative to the corresponding sub-pixel openings 130, so that the light emitted by the light-emitting devices EM can be fully emitted through the first light transmission openings BM1.

For example, in some embodiments, as shown in FIG. 2, the display substrate further includes a plurality of color filters CF, and the plurality of color filters CF are respectively at least partially disposed in the plurality of first light transmission openings BM1; for a first light transmission opening BM1 and a color filter CF at least partially disposed in the first light transmission opening BM1, the orthographic projection of the first light transmission opening BM1 on the base substrate 110 is located within the orthographic projection of the color filter CF on the base substrate 110, that is, the setting range of the color filter CF is greater than the setting range of the first light transmission opening BM1.

For example, in some embodiments, the plurality of sub-pixels include first sub-pixels R, second sub-pixels G, and third sub-pixels B. The plurality of color filters CF include first color filters RCF for the first sub-pixels R, second color filters GCF for the second sub-pixels G, and third color filters BCF for the third sub-pixels B.

For example, in some embodiments, the first sub-pixels are red sub-pixels, the second sub-pixels are green sub-pixels, and the third sub-pixels are blue sub-pixels; accordingly, the first color filters RCF are red filters, the second color filters GCF are green filters, and the third color filters BCF are blue filters.

Alternatively, in some other embodiments, the first sub-pixels R may also be green sub-pixels or blue sub-pixels, the second sub-pixels G may also be red sub-pixels or blue sub-pixels, and the third sub-pixels B may also be red sub-pixels or green sub-pixels. In this case, color filters with corresponding colors are disposed on the respective sub-pixels.

For example, in some other embodiments, the display substrate may further include a color filter layer disposed on a side of the black matrix layer BM away from the base substrate, and the color filter layer has a grid structure. For example, the color filter layer includes at least one of a first color filter layer (such as a red filter layer), a second color filter layer (such as a green filter layer), and a third color filter layer (such as a blue filter layer). In this case, the first color filter layer is hollowed out at the second light transmission openings BM2 corresponding to the second sub-pixel G and the third sub-pixel B, for example, the first color filter RCF is filled at the hollowed position; the second color filter layer is hollowed out at the second light transmission openings BM2 corresponding to the first sub-pixel R and the third sub-pixel B, for example, the second color filter GCF is filled at the hollowed position; the third color filter layer is hollowed out at the second light transmission openings BM2 corresponding to the first sub-pixel R and the second sub-pixel G, for example, the third color filter BCF is filled at the hollowed position. Thus, the reflectivity of light in the display substrate can be further reduced.

Figure 6:
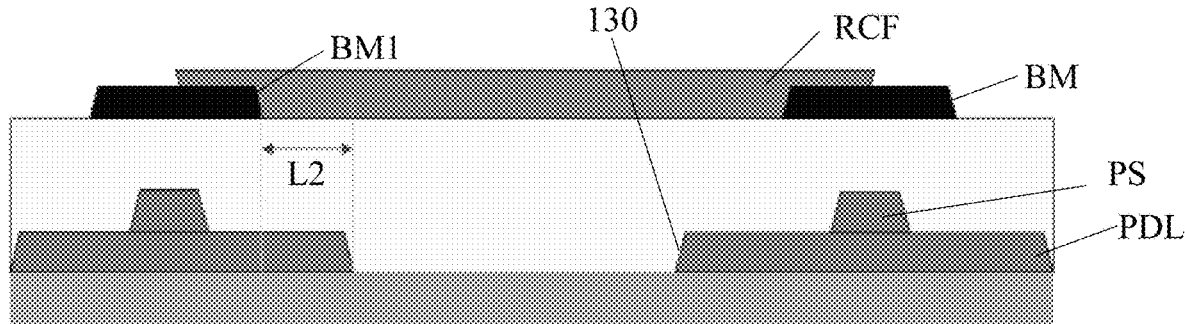
FIG. 6 is a schematic partial sectional view of a black matrix layer being laminated with a spacer layer and a color filter in a display substrate provided by at least one embodiment of the present disclosure.

For example, FIG. 5 is a plane layout view of a plurality of first color filters RCF. As shown in FIG. 5, the setting range of the first color filter RCF is larger than the setting range of the first light transmission opening BM1 corresponding to the first sub-pixel R. For example, FIG. 6 is a partial sectional view illustrating the first light transmission opening BM1, the first color filter RCF and the sub-pixel opening 130. As shown in FIG. 5 and FIG. 6, the setting range of the first light transmission opening BM1 is greater than the setting range of the sub-pixel opening 130, the setting range of the first color filter RCF is greater than the setting range of the first light transmission opening BM1, and the distance L2 between the boundary of the orthographic projection of the sub-pixel opening 130 on the base substrate 110 and the boundary of the orthographic projection of the first light transmission opening BM1 on the base substrate 110 is 1.0 μm-6.5 μm, such as 3 μm-6 μm.

For example, as shown in FIG. 6, the width of the spacer PS may be disposed as being smaller than the width of the opaque area of the black matrix layer BM. In some other embodiments, the width of the spacer PS may also be larger than the width of the opaque area of the black matrix layer BM. In this case, even if light is irradiated on the spacer PS, the spacer PS would not reflect light and cause color separation phenomenon, as such, the design freedom of the black matrix layer BM can be improved.

Figure 7:
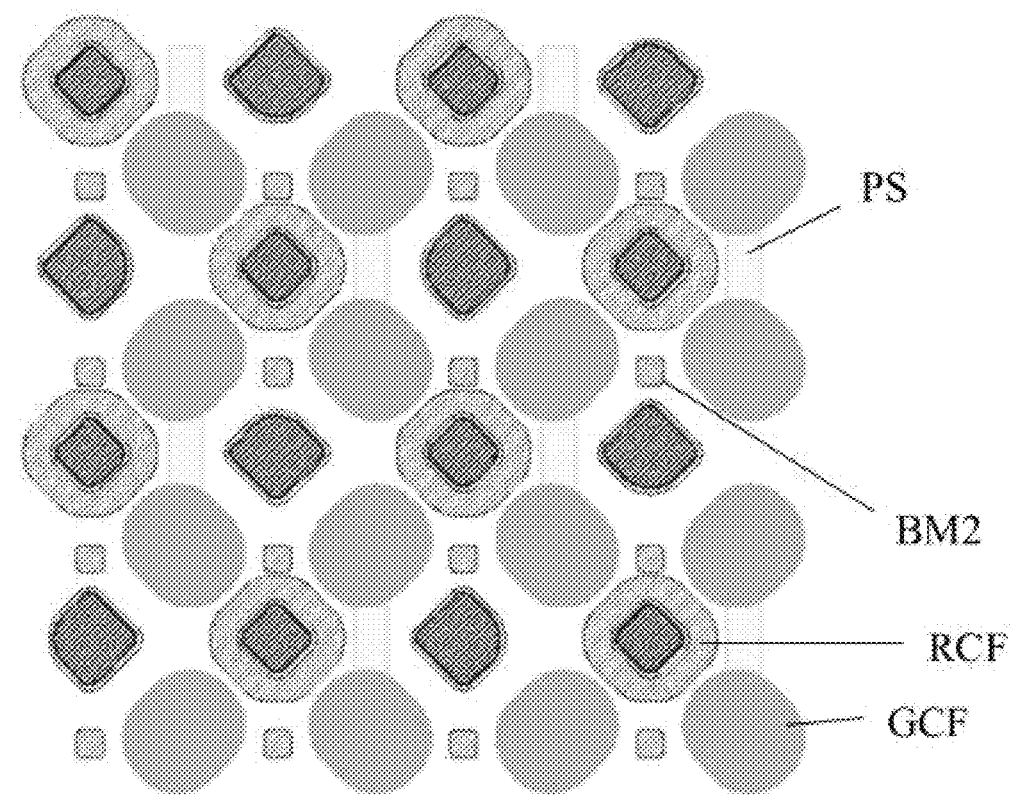
FIG. 7 is a schematic partial plan view of a black matrix layer being laminated with a spacer layer, a first color filter and a second color filter in a display substrate provided by at least one embodiment of the present disclosure.
Figure 8:
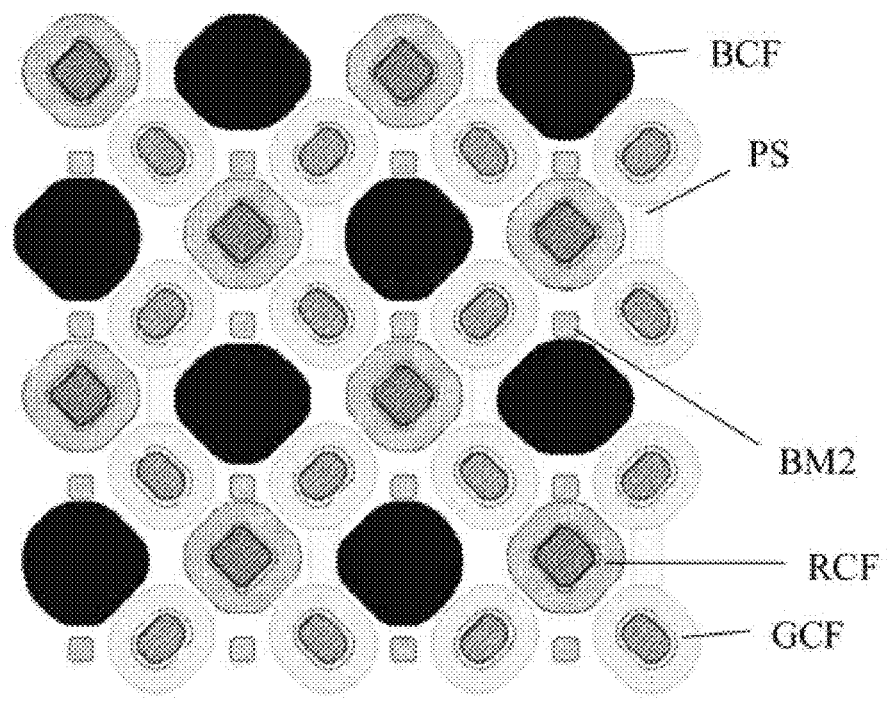
FIG. 8 is a schematic partial plan view of a black matrix layer being laminated with a spacer layer, a first color filter, a second color filter and a third color filter in a display substrate provided by at least one embodiment of the present disclosure.

For example, FIG. 7 illustrates a case where second color filters GCF are disposed on the basis of FIG. 5, and FIG. 8 illustrates a case where third color filters BCF are disposed on the basis of FIG. 7. As shown in FIG. 7 and FIG. 8, in both the second sub-pixel and the third sub-pixel, the setting range of the first light transmission opening BM1 is also greater than the setting range of the sub-pixel opening 130, and the setting range of the second color filter GCF/the third color filter BCF is greater than the setting range of the first light transmission opening BM1, and the distance L2 between the boundary of the orthographic projection of the sub-pixel opening 130 on the base substrate 110 and the boundary of the orthographic projection of the first light transmission opening BM1 on the base substrate 110 is 1.0 μm-6.5 μm, such as 3 μm-6 μm.

For example, in some embodiments, as shown in FIG. 5, FIG. 7 and FIG. 8, the black matrix layer BM further includes a plurality of second light transmission openings BM2, and the plurality of second light transmission openings BM2 are respectively disposed between the two adjacent first light transmission openings BM1 among the plurality of first light transmission openings BM1. The plurality of second light transmission openings BM2 can pass through, for example, signal light for fingerprint identification or signal light required by devices such as cameras, distance sensors, infrared sensors and so on.

Figure 9:
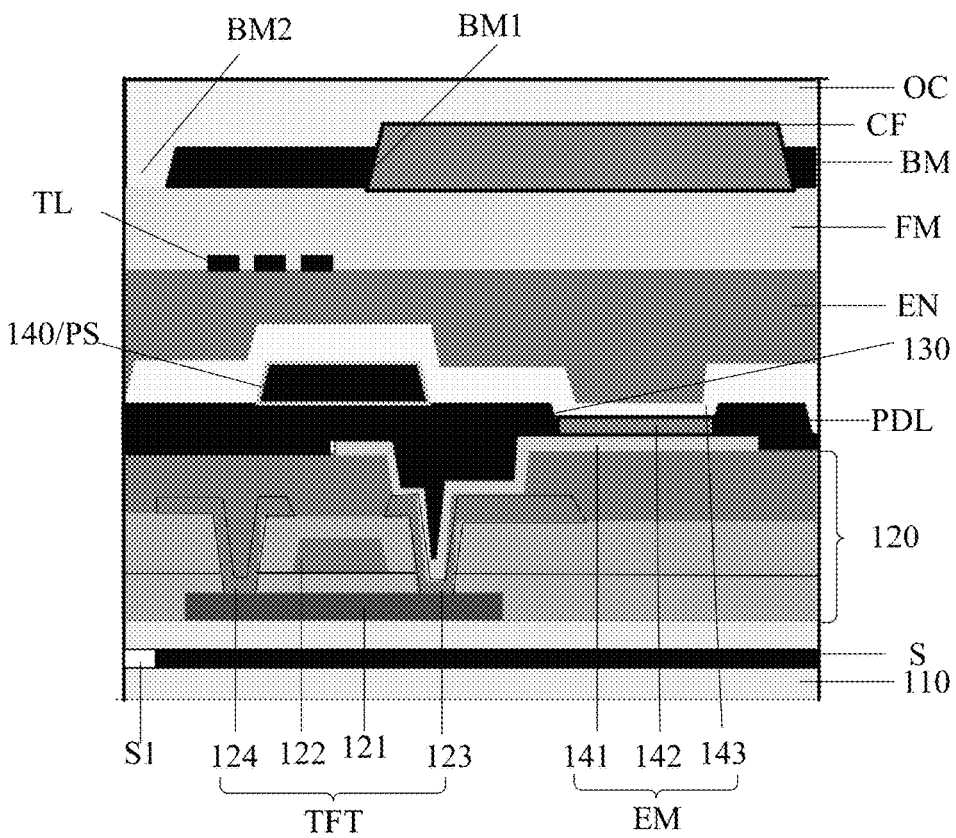
FIG. 9 is another schematic partial sectional view of a display substrate provided by at least one embodiment of the present disclosure.

For example, in some embodiments, as shown in FIG. 9, the display substrate further includes a light shielding layer S disposed on the base substrate 110, and the pixel driving circuit layer 120 is disposed on a side of the light shielding layer S away from the base substrate 110. The light shielding layer S includes a plurality of third light transmission openings S1, and the orthographic projection of at least part of the plurality of third light transmission openings S1 on the base substrate 110 is at least partially overlapped with the orthographic projection of the plurality of second light transmission openings BM2 on the base substrate 110.

Therefore, the third light transmission opening S1 and the second light transmission opening BM2 form a sleeve hole to pass through signal light for fingerprint identification, for example. In this case, an image sensor may be disposed on a side of the base substrate 110 away from the light-emitting device EM, which can receive the signal light transmitted through the second light transmission opening BM2 and the third light transmission opening S1 to perform the function of fingerprint acquisition and recognition.

For example, in some embodiments, the material of the light shielding layer 110 may be metal materials such as copper, aluminum, etc., or alloy materials; alternatively, the light shielding layer 110 may also be a black opaque layer formed by doping black dye in a resin material.

In the embodiment of the present disclosure, the signal light for fingerprint identification can pass through the light shielding layer S at the location of the first light transmission opening S1, and the other positions of the light shielding layer S can block the light emitted by the light-emitting device EM of the display substrate and non-signal light such as ambient light to avoid non-signal light from being irradiated on the image sensor disposed on the non-display side of the display substrate, thereby improving the recognition speed and accuracy of the image sensor.

For example, in some embodiments, the pixel driving circuit layer includes a plurality of metal layers, such as metal layers where the above-described gate electrode 122, first electrode 123, second electrode 124 and the like are located. The orthographic projection of the circuit pattern formed by these metal layers on the base substrate 110 is not overlapped with the orthographic projections of the plurality of first light transmission openings S1 on the base substrate 110, and also not overlapped with the orthographic projections of the third light transmission openings BM2 on the base substrate 110, so as to avoid the circuit pattern from affecting the transmission of signal light.

Figure 10:
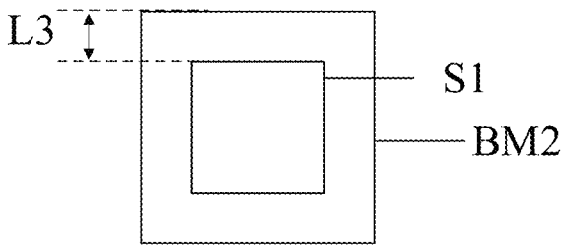
FIG. 10 is a schematic plan view of a second light transmission opening being laminated with a third light transmission opening in a display substrate provided by at least one embodiment of the present disclosure.

For example, FIG. 10 is a schematic view illustrating orthographic projections of one third light transmission opening S1 and a corresponding second light transmission opening BM2 on the base substrate 110. As shown in FIG. 10, the orthographic projections of a plurality of third light transmission openings S1 on the base substrate 110 are respectively located within the orthographic projections of a plurality of second light transmission openings BM2 on the base substrate 110.

For example, as shown in FIG. 10, in some embodiments, the distances L3 respectively between the boundaries of the orthographic projections of at least part of a plurality of third light transmission openings S1 on the base substrate 110 and the boundaries of the orthographic projections of a plurality of second light transmission openings BM2 on the base substrate 110 are in a range of 0.5 μm-1.5 μm, such as 0.8 μm, 1.0 μm, 1.2 μm or 1.5 μm, etc. Thus, the signal light can fully pass through the second light transmission opening BM2 and the third light transmission opening S1 to reach the image sensor.

For example, in some embodiments, as shown in FIG. 7, at least part of the plurality of second light transmission openings BM2 are located between the first light transmission openings BM1 corresponding to the first sub-pixels R and the third sub-pixels B that are adjacent, and the distance between the second light transmission opening BM2 and the first light transmission opening BM1 corresponding to the first sub-pixel R is different from the distance between the second light transmission opening BM2 and the first light transmission opening BM1 corresponding to the third sub-pixel B, for example, the distance between the second light transmission opening BM2 and the first light transmission opening BM1 corresponding to the third sub-pixel B is closer.

For example, in some embodiments, as shown in FIG. 7, the first sub-pixels R and the third sub-pixels B are arranged in multiple rows and columns, and a plurality of first sub-pixels R and a plurality of third sub-pixels B that are located in the same column are alternately arranged, and one second light transmission opening BM2 is disposed between the first light transmission openings BM1 corresponding to the first sub-pixel R and the third sub-pixel B that are adjacent in the same column.

For example, in some embodiments, as shown in FIG. 7, one first sub-pixel R, two second sub-pixels G and one third sub-pixel B constitute one repeating unit, and a plurality of repeating units are arranged in an array. A plurality of second sub-pixels G in a plurality of repeating units are arranged in multiple rows and columns, and the second light transmission openings BM2 are further respectively arranged between the first light transmission openings BM1 corresponding to the second sub-pixels R that are adjacent in the row direction.

Through the above arrangement, the setting of the second light transmission openings BM2 and the third light transmission openings S1 would not affect the original circuit setting on the display substrate, and the original circuit setting would not affect the signal light to sequentially pass through the second light transmission opening BM2 and the third light transmission opening S1 and reach the image sensor.

For example, referring to FIG. 5, the orthographic projection of each of the plurality of spacers PS on the base substrate 110 is located between the orthographic projections of the sub-pixel openings 130 of the second sub-pixels G that are adjacent in the column direction on the base substrate 110, and located between the orthographic projections of the sub-pixel openings 130 of the first sub-pixel R and the third sub-pixel B that are adjacent in the row direction on the base substrate 110.

For example, referring to FIG. 3, the shortest distance L11 between the orthographic projection of each of the plurality of spacers PS on the base substrate 110 and the orthographic projection of the sub-pixel opening 130 of the first sub-pixel R among the adjacent first sub-pixel R and third sub-pixel B on the base substrate 110 is larger than the shortest distance L12 between the orthographic projection of the each of the plurality of spacers PS on the base substrate 110 and the orthographic projection of the sub-pixel opening 130 of the third sub-pixel B among the adjacent first sub-pixel R and third sub-pixel B on the base substrate 110. That is, the spacer PS disposed between the first sub-pixel R and the third sub-pixel B that are adjacent is closer to the sub-pixel opening 130 of the third sub-pixel B than the sub-pixel opening 130 of the first sub-pixel R.

For example, in some embodiments, referring to FIG. 3, the shortest distances L13 between the orthographic projection of each of the plurality of spacers PS on the base substrate 110 and the orthographic projections of the sub-pixel openings 130 of the adjacent second sub-pixels G on the base substrate 110 are substantially the same, that is, the distances between the spacer PS (that is disposed between the adjacent second sub-pixels G) and the sub-pixel openings 130 of the adjacent second sub-pixels G are substantially the same.

Therefore, a plurality of spacers PS and the third light transmission opening S1 are periodically arranged in the display substrate without affecting each other.

For example, in some embodiments, as shown in FIG. 8, one first sub-pixel R, two second sub-pixels G and one third sub-pixel B constitute a repeating unit, and each repeating unit is correspondingly provided with two third light transmission openings S1. For example, each third light transmission opening S1 is correspondingly provided with one second light transmission opening BM2, alternatively, in some embodiments, one third light transmission opening S1 of every two or more third light transmission openings S1 is correspondingly provided with one second light transmission opening BM2. That is, one third light transmission opening S1 of every two or more third light transmission openings S1 corresponds with one second light transmission opening BM2 to form a sleeve hole, while other third light transmission openings S1 are blocked by the black matrix layer BM, and are not used to form sleeve holes.

For example, in some embodiments, as shown in FIG. 8, each repeating unit is correspondingly provided with one spacer PS, alternatively, in other embodiments, two or more repeating units may be correspondingly provided with one spacer PS, which is not limited by the embodiments of the disclosure.

For example, in some embodiments, as shown in FIG. 2 and FIG. 9, the display substrate further includes an encapsulation layer EN disposed on a side of the light-emitting device EM away from the base substrate 110, and the black matrix layer BM is disposed on the side of the encapsulation layer EN away from the base substrate 110. For example, the encapsulation layer EN may be a composite encapsulation layer and includes a first inorganic encapsulation layer, a first organic encapsulation layer and a second inorganic encapsulation layer (not shown in the figure) that are sequentially disposed on the light-emitting device EM to improve the encapsulation effect.

For example, in some embodiments, color filters for a plurality of sub-pixels may be disposed in the composite encapsulation layer, for example, between two adjacent sub-encapsulation layers in the composite encapsulation layer. For example, in one example, the composite encapsulation layer includes the first inorganic encapsulation layer, the first organic encapsulation layer, the second inorganic encapsulation layer and the third inorganic encapsulation layer sequentially disposed on the light-emitting device EM. In this case, the color filters may be disposed between the second inorganic encapsulation layer and the third inorganic encapsulation layer.

For example, in some embodiments, as shown in FIG. 9, the display substrate further includes a touch layer FM disposed on a side of the encapsulation layer EN away from the base substrate 110, and the black matrix layer BM is disposed on a side of the touch layer FM away from the base substrate 110.

Figure 11:
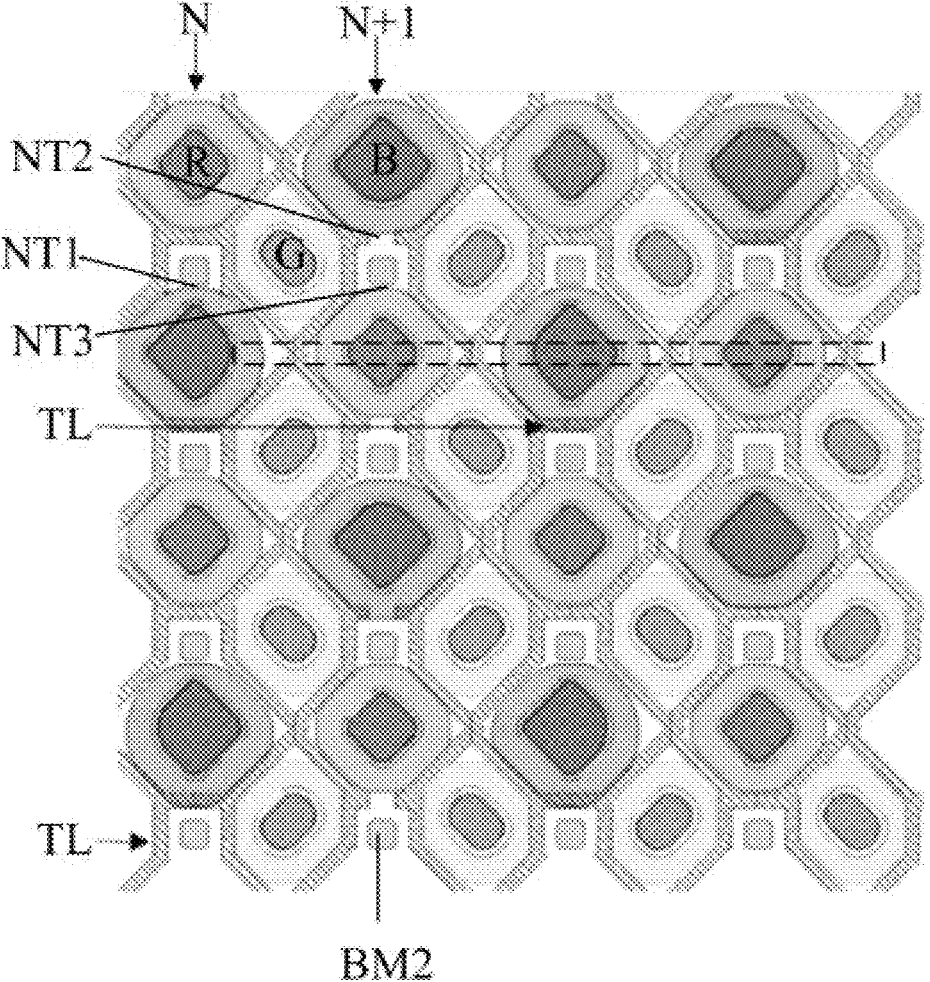
FIG. 11 is a schematic partial plan view of a black matrix layer being laminated with a touch layer, a first color filter, a second color filter and a third color filter in a display substrate provided by at least one embodiment of the present disclosure.

For example, FIG. 11 illustrates a plan view of the touch layer FM, as shown in FIG. 9 and FIG. 11, the touch layer FM includes a plurality of touch lines TL. The orthographic projections of the plurality of touch lines TL on the base substrate 110 does not overlap with the orthographic projections of the plurality of second light transmission openings BM2 on the base substrate 110. For example, the orthographic projections of the plurality of touch lines TL on the base substrate 110 does not overlap the orthographic projections of a plurality of first light transmission openings BM1 on the base substrate 110 as well. As such, the plurality of touch lines TL are blocked by the black matrix layer BM to prevent light from being irradiated on the touch lines TL and affecting the signal transmission performance of the touch lines TL.

For example, in some embodiments, as shown in FIG. 11, in the same direction parallel to the base substrate 110, the distances between the plurality of touch lines TL and at least two of the first color filter RCF, the second color filter GCF and the third color filter BCF is different. For example, at the position of the dashed box, in the horizontal direction of FIG. 11, the distance between the touch line TL and the third color filter BCF is greater than the distance between the touch line TL and the first color filter RCF. Due to the irregular shape and layout of the third color filter BCF, the distance between the touch line TL and the third color filter BCF in this direction is disposed to be larger, which can avoid the overlapping of the touch lines TL and the third color filters BCF in this direction, or avoid the overlapping size thereof being too large.

For example, in some embodiments, as shown in FIG. 11, the first sub-pixels R and the third sub-pixels B are arranged in multiple rows and columns, and the plurality of first sub-pixels R and the plurality of third sub-pixels B located in the same column are arranged alternately. For example, at least part of a plurality of touch lines TL has a gap NT1/NT2/NT3 between the first sub-pixel R and the third sub-pixel B that are adjacent in the same column.

For example, as shown in FIG. 11, at least part of a plurality of touch lines TL has a gap NT1 at the side close to the third sub-pixel B or the side close the first sub-pixel R among the first sub-pixel R and the third sub-pixel B that are adjacent in the same column. In this case, at least part of a plurality of touch lines TL has one gap between the first sub-pixel R and the third sub-pixel B that are adjacent in the same column; alternatively, at least part of a plurality of touch lines TL has gaps NT2/NT3 at both the side close to the third sub-pixel B and the side close to the first sub-pixel R among the first sub-pixel R and the third sub-pixel B that are adjacent in the same column. In this case, at least part of the plurality of touch lines TL has two gaps between the first sub-pixel R and the third sub-pixel B that are adjacent in the same column.

For example, in some embodiments, as shown in FIG. 11, at least part of the plurality of touch lines TL has a gap NT1 at the side close to the third sub-pixel B or the side close to the first sub-pixel R among the first sub-pixel R and the third sub-pixel B that are adjacent in the N-th column, and at least part of the plurality of touch lines TL has gaps NT2/NT3 at both the side close to the third sub-pixel B and the side close to the first sub-pixel R among the first sub-pixel R and the third sub-pixel B that are adjacent in the (N+1)-th column. In this case, in every two adjacent columns of the first sub-pixels R and the third sub-pixels B, there is one gap between the first sub-pixel R and the third sub-pixel B that are adjacent in one of the two adjacent columns, and there are two gaps between the first sub-pixel R and the third sub-pixel B that are adjacent in the other one of the two adjacent columns.

For example, the display substrate can further includes other structures such as a cover plate, the details of which can refer to relevant technologies, which are not repeated here.

Figure 12:
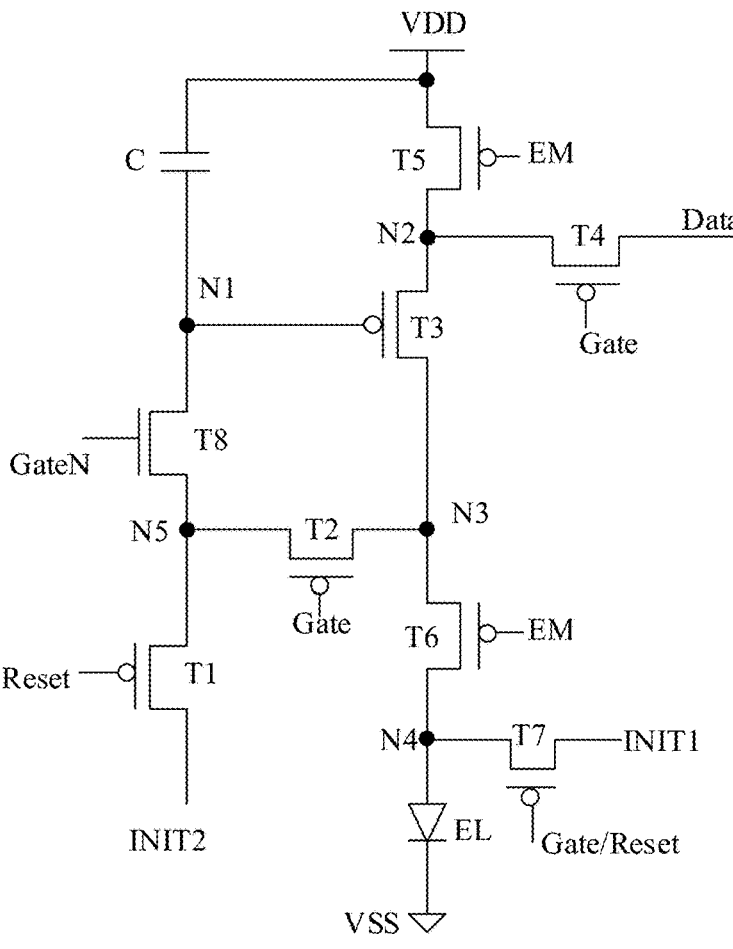
FIG. 12 is an equivalent circuit diagram of an 8T1C pixel driving circuit provided by at least one embodiment of the present disclosure.

For example, in various embodiments of the present disclosure, the pixel driving circuit may have a 3T1C, 4T1C, 5T1C, 5T2C, 6T1C, 7T1C or 8T1C structure. For example, FIG. 12 is an equivalent circuit view of an 8T1C pixel driving circuit. As shown in FIG. 12, the pixel driving circuit may include eight transistors (a first transistor T1 to an eighth transistor T8), one storage capacitor C, and a plurality of signal lines (for example, a data signal line Data, a first scanning signal line Gate, a second scanning signal line GateN, a reset control signal line Reset, a first initial signal line INIT1, a second initial signal line INIT2, a first power line VDD, a second power line VSS, and a light-emitting control signal line EM, etc.).

For example, a gate electrode of the first transistor T1 is connected to the reset control signal line Reset, a first electrode of the first transistor T1 is connected to the second initial signal line INIT2, and a second electrode of the first transistor T1 is connected to the fifth node N5. A gate electrode of the second transistor T2 is connected to the first scanning signal line Gate, a first electrode of the second transistor T2 is connected to the fifth node N5, and a second electrode of the second transistor T2 is connected to a third node N3. A gate electrode of the third transistor T3 is connected to a first node N1, a first electrode of the third transistor T3 is connected to a second node N2, and a second electrode of the third transistor T3 is connected to the third node N3. A gate electrode of the fourth transistor T4 is connected to the first scanning signal line Gate, a first electrode of the fourth transistor T4 is connected to the data signal line Data, and a second electrode of the fourth transistor T4 is connected to the second node N2. A gate electrode of the fifth transistor T5 is connected to the light-emitting control signal line EM, a first electrode of the fifth transistor T5 is connected to the first power line VDD, and a second electrode of the fifth transistor T5 is connected to the second node N2. A gate electrode of the sixth transistor T6 is connected to the light-emitting control signal line EM, a first electrode of the sixth transistor T6 is connected to the third node N3, and a second electrode of the sixth transistor T6 is connected to a fourth node N4 (that is, a first electrode of the light-emitting device). A gate electrode of the seventh transistor T7 is connected to the first scanning signal line Gate or the reset control signal line Reset, a first electrode of the seventh transistor T7 is connected to the first initial signal line INIT1, and a second electrode of the seventh transistor T7 is connected to the fourth node N4. A gate electrode of the eighth transistor T8 is connected to the second scanning signal line GateN, a first electrode of the eighth transistor T8 is connected to the fifth node N5, and a second electrode of the eighth transistor T8 is connected to the first node N1. A first end of the storage capacitor C is connected to the first power line VDD, and a second end of the storage capacitor C is connected to the first node N1.

In some embodiments, the first transistor T1 to the seventh transistor T7 may be N-type thin film transistors, and the eighth transistor T8 may be P-type thin film transistor; alternatively, the first transistor T1 to the seventh transistor T7 may be P-type thin film transistors, and the eighth transistor T8 may be N-type thin film transistor.

In some embodiments, the first transistor T1 to the seventh transistor T7 may be Low Temperature Poly Silicon (LTPS) Thin Film Transistors (TFT), and the eighth transistor T8 may be Indium Gallium Zinc Oxide (IGZO) TFT.

In the above embodiment, the IGZO TFT produces less leakage current than the LTPS TFT. Therefore, setting the eighth transistor T8 as an IGZO TFT can significantly reduce the generation of leakage current, thus improving the issues of low frequency and low brightness flicker of the display panel. In addition, the first transistor T1 and the second transistor T2 do not need to be set as the IGZO TFTs, because the size of the LTPS TFT is generally smaller than the IGZO TFT, the space occupied by the pixel driving circuit of the embodiment of the present disclosure would be relatively small, which is conducive to improve the resolution of the display panel.

The above pixel driving circuit provided by the embodiment of the present disclosure combines the good switching property of LTPS-TFT and the low leakage property of Oxide-TFT, which can achieve low frequency driving (1 Hz-60 Hz) and greatly reduce the power consumption of the display screen.

In some embodiments, the second electrode of the light-emitting device is connected to the second power line VSS, the signal of the second power line VSS is a continuously provided low level signal, and the signal of the first power line VDD is a continuously provided high level signal. The signal of the first scanning signal line Gate is a scanning signal in the pixel driving circuit of current display line, and the signal of the reset control signal line Reset is a scanning signal in the pixel driving circuit of a previous display line. That is, for the n-th display line, the first scanning signal line Gate is Gate (n), and the reset control signal line Reset is Gate (n−1), the signal of the reset control signal line Reset of current display line and the signal of the first scanning signal line Gate in the pixel driving circuit of the previous display line may be the same signal, so as to reduce the amount of signal lines of the display panel and realize the narrow frame of the display panel.

In some embodiments, the first scanning signal line Gate, the second scanning signal line GateN, the reset control signal line Reset, the light-emitting control signal line EM, the first initial signal line INIT1 and the second initial signal line INIT2 all extend horizontally, and the second power line VSS, the first power line VDD and the data signal line DATA all extend vertically.

In some embodiments, at least part of the first initial signal line INIT1, the second initial signal line INIT2, the second power line VSS, and the first power line VDD may be mesh structure, that is, include both horizontal extension parts and vertical extension parts.

Figure 13:
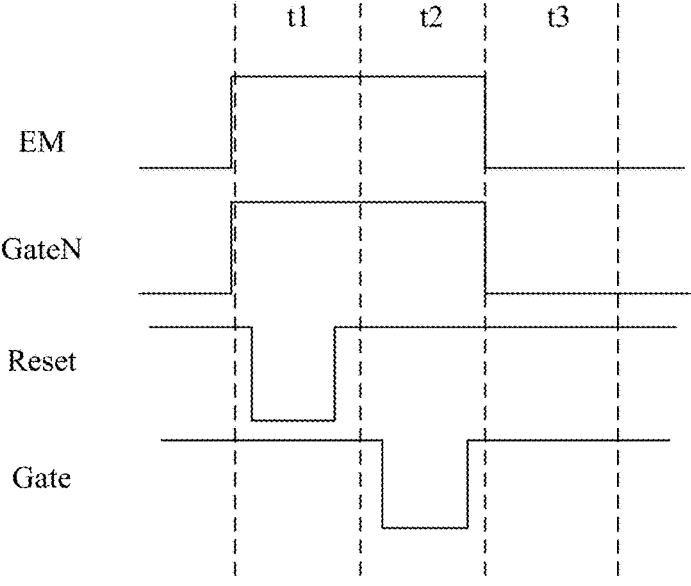
FIG. 13 is a working sequence diagram of a pixel driving circuit provided by at least one embodiment of the present disclosure.

FIG. 13 is a working sequence diagram of a pixel driving circuit. The exemplary embodiment of the present disclosure is described below through the working process of the pixel driving circuit illustrated in FIG. 12. The pixel driving circuit in FIG. 12 includes eight transistors (the first transistor T1 to the eighth transistor T8) and one storage capacitor C. This embodiment is illustrated by taking the first transistor T1 to the seventh transistor T7 being P-type transistors, the eighth transistor T8 being an N-type transistor, and the gate electrode of the seventh transistor T7 being connected to the first scanning signal line Gate as an example.

For example, in some embodiments, the working process of the pixel driving circuit may include the following several stages.

In a first stage t1, which is referred to as a reset stage, the signals of the first scanning signal line Gate, the reset control signal line Reset, the second scanning signal line GateN and the light-emitting control signal line EM are all high level signals, and the signal of the reset control signal line Reset is a low level signal. The high level signal of the light-emitting control signal line EM causes the fifth transistor T5 and the sixth transistor T6 to turn off, the high level signal of the second scanning signal line GateN causes the eighth transistor T8 to turn on, and the low level signal of the reset control signal line Reset causes the first transistor T1 to turn on. Therefore, the voltage of the first node N1 is reset to be a second initial voltage Vinit2 provided by the second initial signal line INIT2, then the potential of the reset control signal line Reset is set to be high, and the first transistor T1 is turned off. Because the fifth transistor T5 and the sixth transistor T6 are turned off, the light-emitting device EL does not emit light at this stage.

In a second stage t2, which is referred to as a data writing stage. The signal of the first scanning signal line Gate is a low level signal, the fourth transistor T4, the second transistor T2 and the seventh transistor T7 are turned on, the data signal line Data outputs the data voltage, and the voltage of the fourth node N4 is reset to the first initial voltage Vinit1 provided by the first initial voltage line INIT1, and the initialization is completed. At this stage, because the first node N1 is at a low level voltage, the third transistor T3 is turned on. The fourth transistor T4 and the second transistor T2 are turned on so that the data voltage output by the data signal line Data is supplied to the first node N1 through the fourth transistor T4 that is turned on, the second node N2, the third transistor T3 that is turned on, the third node N3, the second transistor T2 that is turned on, the fifth node N5 and the eighth transistor T8, and the sum of the data voltage output by the data signal line Data and the threshold voltage of the third transistor T3 is charged into the storage capacitor C. The voltage of the second terminal (the first node N1) of the storage capacitor C is Vdata+Vth, Vdata is the data voltage output by the data signal line Data, and Vth is the threshold voltage of the third transistor T3. The signal of the light-emitting control signal line EM is a high level signal. The fifth transistor T5 and the sixth transistor T6 are turned off to ensure that the light-emitting device EL does not emit light.

In a third stage t3, which is referred to as a light-emitting stage, the signals of the first scanning signal line Gate and the reset control signal line Reset are high level signals, and the signals of the light-emitting control signal line EM and the second scanning signal line GateN are low level signals. The high level signal of the reset control signal line Reset causes the seventh transistor T7 to turn off, and the low level signal of the light-emitting control signal line EM causes the fifth transistor T5 and the sixth transistor T6 to turn on. The power voltage output by the first power line VDD supplies the driving voltage to the first electrode (i.e. the fourth node N4) of the light-emitting device EL through the fifth transistor T5, the third transistor T3 and the sixth transistor T6 that are turned on, so as to drive the light-emitting device EL to emit light.

In the driving process of the pixel driving circuit, the driving current flowing through the third transistor T3 (i.e. the third transistor) is determined by the voltage difference between the gate electrode and the first electrode thereof. Since the voltage of the first node N1 is Vdata+Vth, the driving current of the third transistor T3 is:

$$I = K * (Vgs - Vth)^2 =$$
$$K * [(Vdata + Vth - Vdd) - Vth]^2 = K * [(Vdata - Vdd)]^2$$

Wherein, I is the driving current flowing through the third transistor T3, that is, the driving current driving the light-emitting device EL, K is a constant, Vgs is the voltage difference between the gate electrode and the first electrode of the third transistor T3, Vth is the threshold voltage of the third transistor T3, Vdata is the data voltage output by the data signal line Data, and Vdd is the power voltage output by the first power line VDD.

It can be seen from the above formula that, the current I flowing through the light-emitting device EL is independent of the threshold voltage Vth of the third transistor T3, which eliminates the influence of the threshold voltage Vth of the third transistor T3 on the current I and ensures the uniformity of brightness.

Based on the above working sequence, the pixel driving circuit eliminates the residual positive charge of the light-emitting device EL after the previous light emission, realizing the compensation of the gate voltage of the third transistor, and avoiding the influence of the threshold voltage shift of the third transistor on the driving current of the light-emitting device EL, and improving the uniformity of the display image and the display quality of the display panel.

The pixel driving circuit of the embodiment of the present disclosure can respectively adjust the reset voltage of the light-emitting device EL and the reset voltage of the first node N1 by initializing the fourth node N4 as the signal of the first initial signal line INIT1, and initializing the fifth node N5 as the signal of the second initial signal line INIT2, so as to achieve better display effect and improve issues such as low-frequency flicker.

For example, FIG. 14 to FIG. 25 are schematic plan views illustrating various layers of the display substrate provided by at least one embodiment of the present disclosure.

Figure 14:
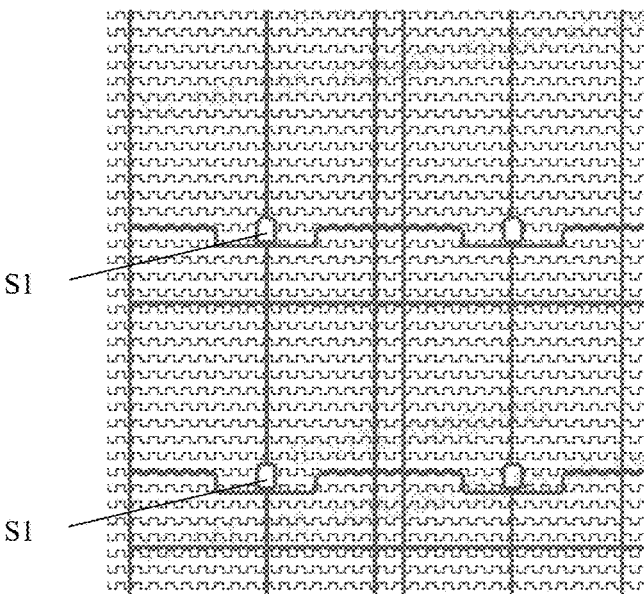
FIG. 14 to FIG. 25 are plan views of various layers of a display substrate provided by at least one embodiment of the present disclosure.

For example, FIG. 14 illustrates a schematic plan view of a light shielding layer, which includes a plurality of first light transmission openings (third openings) S1.

Figure 15:
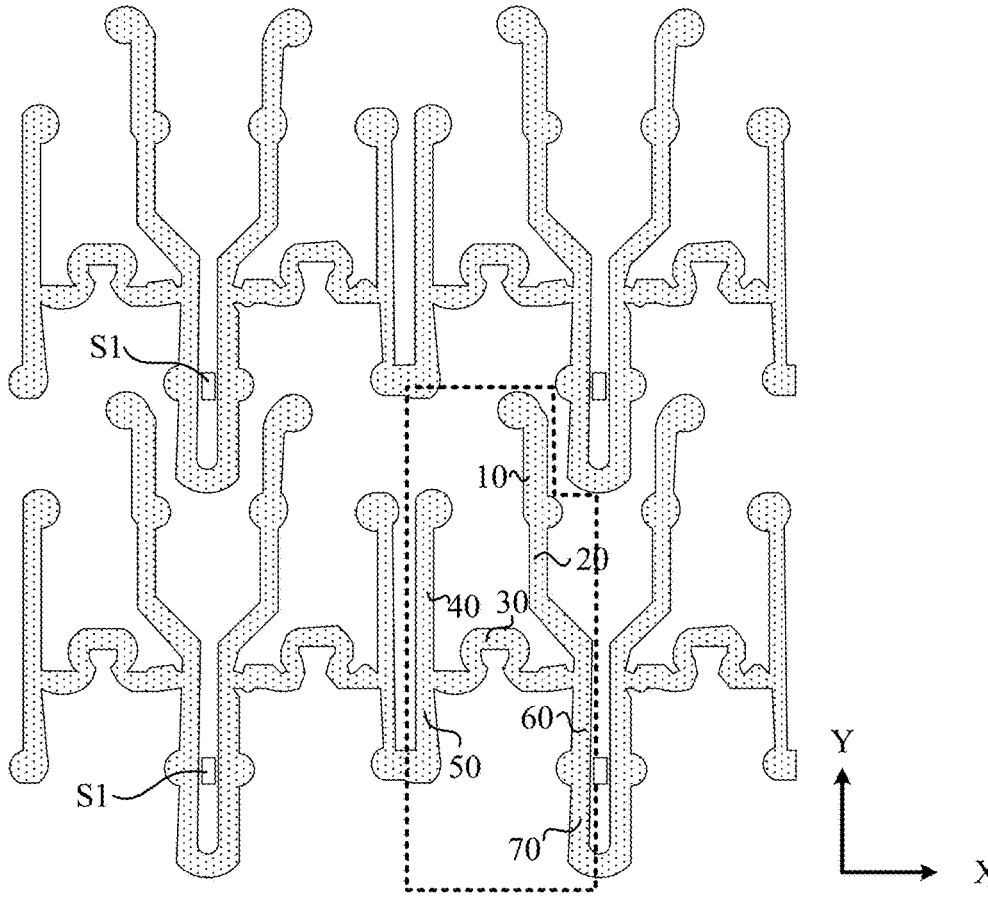

FIG. 15 illustrates a schematic plan view of the first semiconductor layer being laminated after the light shielding layer. The first semiconductor layer includes active layers of a plurality of thin film transistors. The first semiconductor layer may adopt silicon materials, which include amorphous silicon and poly-crystalline silicon; in some embodiments, the first semiconductor layer may use amorphous silicon a-Si to form poly-crystalline silicon through a method such as crystallization or laser annealing.

The range shown in the dashed box in FIG. 15 is the setting range of the pixel driving circuit of one sub-pixel. As shown in FIG. 15, the first semiconductor layer may include a first active layer 10 of the first transistor T1, a second active layer 20 of the second transistor T2, a third active layer 30 of the third transistor T3, a fourth active layer 40 of the fourth transistor T4, a fifth active layer 50 of the fifth transistor T5, a sixth active layer 60 of the sixth transistor T6, and a seventh active layer 70 of the seventh transistor T7. The first active layer 10, the second active layer 20, the third active layer 30, the fourth active layer 40, the fifth active layer 50, the sixth active layer 60 and the seventh active layer 70 are parts of an integrated structure connected to each other.

In some embodiments, the shape of the third active layer 30 may be in a shape of "⊐⌐", and the shapes of the first active layer 10, the second active layer 20, the fourth active layer 40, the fifth active layer 50, the sixth active layer 60, and the seventh active layer 70 may be respective in a shape of "1".

In some embodiments, in the second direction Y, the first semiconductor layers of any two adjacent sub-pixels has a mirror symmetrical structure.

In some embodiments, the channel region of the third active layer 30 extends along the row direction, and the channel regions of the first active layer 10, the second active layer 20, the fourth active layer 40, the fifth active layer 50, the sixth active layer 60, and the seventh active layer 70 extend along the column direction.

For example, the orthographic projection of the third light transmission opening S1 on the base substrate 110 is adjacent to the orthographic projections of the sixth active layer 60 and the seventh active layer 70 on the base substrate 110. Accordingly, the orthographic projection of the second light transmission opening BM2 on the base substrate 110 is adjacent to the orthographic projections of the sixth active layer 60 and the seventh active layer 70 on the base substrate 110.

In some embodiments, the first semiconductor layer may use poly-crystalline silicon (p-Si), that is, the first transistor, the second transistor, the third transistor, the fourth transistor, the fifth transistor, the sixth transistor and the seventh transistor may all be LTPS thin film transistors.

Figure 16:
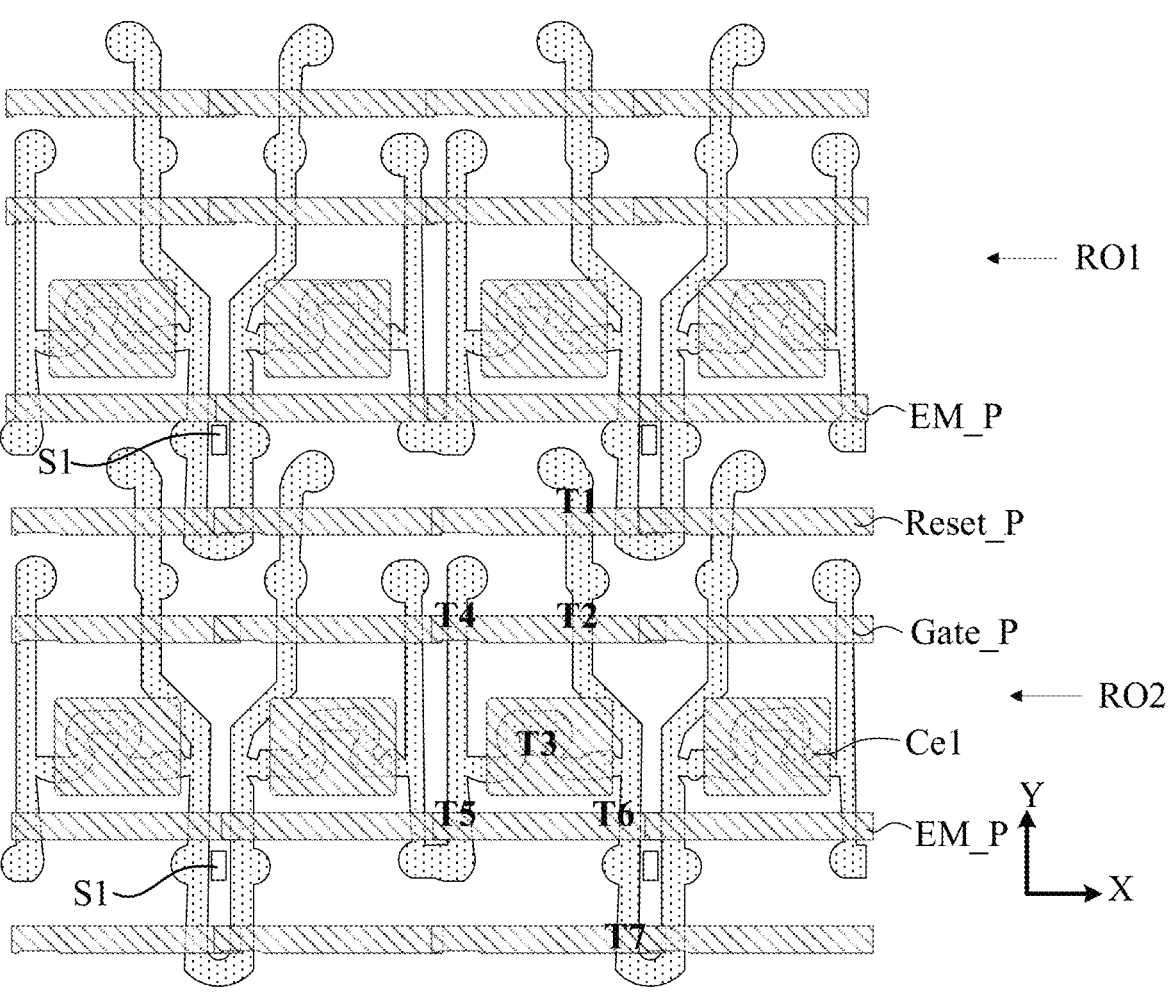

For example, FIG. 16 is a schematic plan view illustrating a first conductive layer being laminated after the first semiconductor layer. In some embodiments, as shown in FIG. 16, the first conductive layer may include: first scanning signal lines Gate_P, reset control signal lines Reset_P, light-emitting control signal lines EM_P and first electrode plates Ce1 of storage capacitors C. In some embodiments, the first conductive layer may be referred to as a first gate metal (GATE 1) layer.

In some embodiments, in the second direction Y, the first conductive layer of any two adjacent sub-pixels has a mirror symmetrical structure.

In some embodiments, the first scanning signal lines Gate_P, the reset control signal lines Reset_P and the light-emitting control signal lines EM_P all extend along the first direction X. Within each sub-pixel, the reset control signal line Reset_P is located at the side of the first scanning signal line Gate_P away from the light-emitting control signal line EM_P, and the first electrode plate Ce1 of the storage capacitor is disposed between the first scanning signal line Gate_P and the light-emitting control signal line EM_P.

For example, the pixel driving circuit layer (for example, the first conductive layer described above) includes first signal lines (for example, the light-emitting control signal lines EM_P in some embodiments) and second signal lines (for example, the reset control signal lines Reset_P in some embodiments) that are periodically arranged in parallel with each other. The first signal lines and the second signal lines are configured to provide different electrical signals to the plurality of sub-pixels. The orthographic projections of the plurality of third light transmission openings S1 on the base substrate 110 are each located between an orthographic projection of one first signal line (for example, the light-emitting control signal line EM_P) on the base substrate 110 and an orthographic projection of one second signal line (for example, the reset control signal line Reset_P) closest to the one first signal line on the base substrate 110. Accordingly, the orthographic projections of a plurality of second light transmission openings BM2 on the base substrate 110 are each located between an orthographic projection of one first signal line (for example, the light-emitting control signal line EM_P) on the base substrate 110 and an orthographic projection of one second signal line (for example, the reset control signal line Reset_P) closest to the one first signal line on the base substrate 110.

For example, the plurality of sub-pixels include a first row of sub-pixels RO1 and a second row of sub-pixels RO2 that is adjacent to and at a next tier of the first row of sub-pixels RO1. The pixel driving circuits of the first row of sub-pixels RO1 share one light-emitting control signal line EM_P and one reset control signal line Reset_P. The pixel driving circuits of the second row of sub-pixels RO2 share one light-emitting control signal line EM_P and one reset control signal line Reset_P. Wherein an orthographic projection of a row of third light transmission openings S1 on the base substrate 110 is located between the orthographic projection of the light-emitting control signal line EM_P shared by the pixel driving circuits of the first row of sub-pixels RO1 on the base substrate 110 and the orthographic projection of the reset control signal line Reset_P shared by the pixel driving circuits of the second row of sub-pixels RO2 on the base substrate 110. Accordingly, an orthographic projection of a row of second light transmission openings BM2 on the base substrate 110 is located between the orthographic projection of the light-emitting control signal line EM_P shared by the pixel driving circuits of the first row of sub-pixels RO1 on the base substrate 110 and the orthographic projection of the reset control signal line Reset_P shared by the pixel driving circuits of the second row of sub-pixels RO2 on the base substrate 110.

In some embodiments, the first electrode plate Ce1 may be rectangular, and the corners of the rectangular shape may be chamfered. The orthographic projection of the first electrode plate Ce1 on the base substrate 110 is overlapped with the orthographic projection of the third active layer 30 of the third transistor T3 on the base substrate 110. In some embodiments, the first electrode plate Ce1 is also used as the gate electrode of the third transistor T3.

In some embodiments, the region of the reset control signal line Reset_P overlapping with the first active layer of the first transistor T1 serves as the gate electrode of the first transistor T1, the region of the first scanning signal line Gate_P overlapping with the second active layer of the second transistor T2 serves as the gate electrode of the second transistor T2, the region of the first scanning signal line Gate_P overlapping with the fourth active layer of the fourth transistor T4 serves as the gate electrode of the fourth transistor T4, the region of the light-emitting control signal line EM_P overlapping with the fifth active layer of the fifth transistor T5 serves as the gate electrode of the fifth transistor T5, and the region of the light-emitting control signal line EM_P overlapping with the sixth active layer of the sixth transistor T6 serves as the gate electrode of the sixth transistor T6. The region of the reset control signal line Reset_P in the next row of sub-pixels of each row of sub-pixels (the same as the signal of the first scanning signal line Gate_P in current row of sub-pixels) overlapping with the seventh active layer of the seventh transistor T7 in current row of sub-pixels serves as the gate electrode of the seventh transistor T7.

Figure 17:
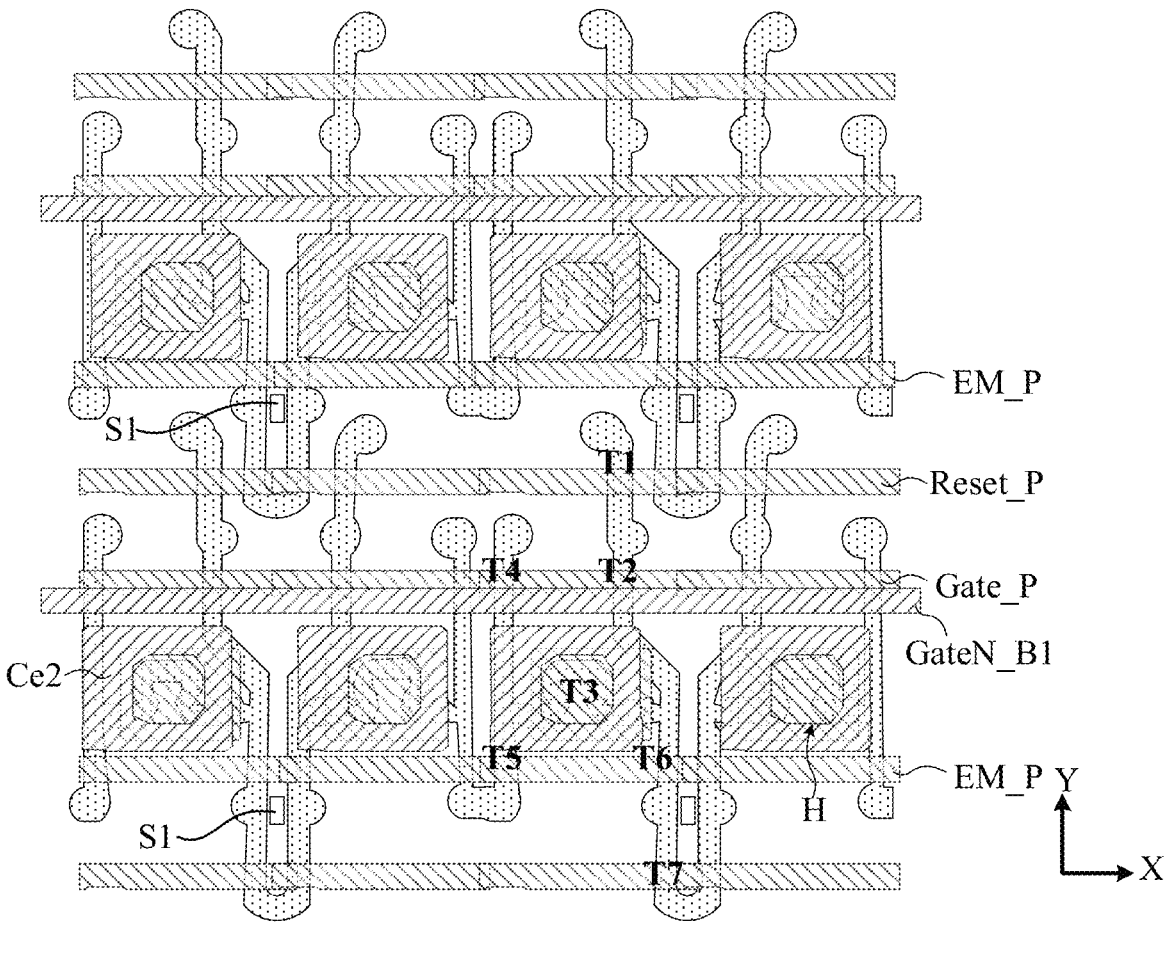

For example, FIG. 17 illustrates a schematic plan view of the second conductive layer being laminated after the first conductive layer. As shown in FIG. 17, the second conductive layer includes: second electrode plates Ce2 of the storage capacitors C and the first branches GateN_B1 of the second scanning signal lines GateN. In some embodiments, the second conductive layer may be referred to as a second gate metal (GATE 2) layer.

In some embodiments, in the second direction Y, the second conductive layer of any two adjacent sub-pixels has a mirror symmetrical structure.

In some embodiments, the first branch GateN_B1 of the second scanning signal line GateN extends in the first direction X. Within each sub-pixel, the second electrode plate Ce2 of the storage capacitor is located between the first branch GateN_B1 of the second scanning signal line GateN and light-emitting control signal line EM_P.

In some embodiments, the contour of the second electrode plate Ce2 may be a rectangular shape, and the corners of the rectangular shape may be chamfered. There is an overlapping region between the orthographic projection of the second electrode plate Ce2 on the base substrate 110 and the orthographic projection of the first electrode plate Ce1 on the base substrate 110. The second electrode plate Ce2 is provided with an opening H, which may be located in the middle of the second electrode plate Ce2. The opening H may be a regular hexagon, which makes the second electrode plate Ce2 form a ring-shaped structure. The opening H exposes the third insulation layer covering the first electrode plate Ce1, and the orthographic projection of the first electrode plate Ce1 on the base substrate 110 includes the orthographic projection of the opening H on the base substrate 110. In some embodiments, the opening H is configured to accommodate the subsequently formed fourth via.

The fourth via is located in the opening H and exposes the first electrode plate Ce1, so that the second electrode of the eighth transistor T8 that is subsequently formed is connected to the first electrode plate Ce1.

Figure 18:
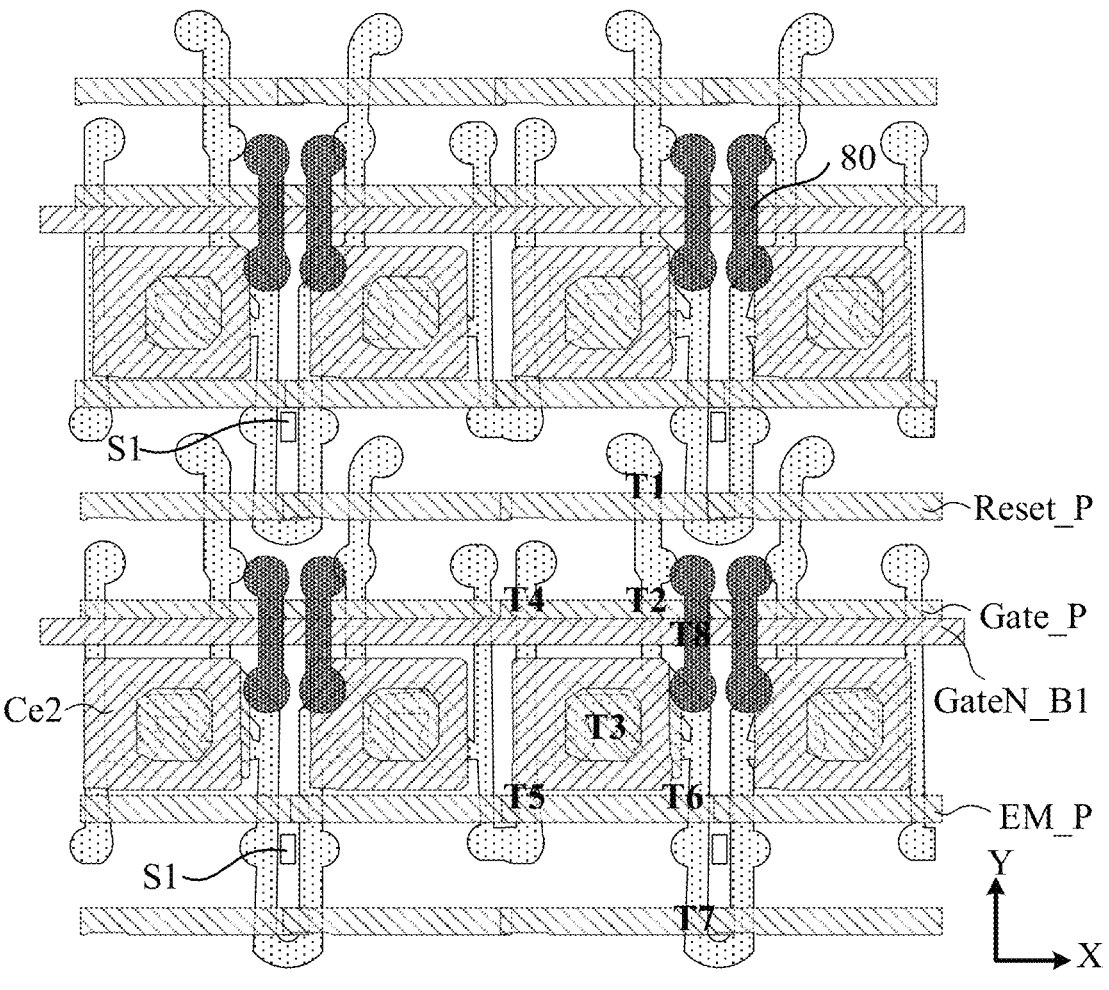

For example, FIG. 18 is a schematic plan view illustrating a second semiconductor layer being laminated after the second conductive layer. In some embodiments, as shown in FIG. 18, the second semiconductor layer of each sub-pixel may include the eighth active layer 80 of the eighth transistor T8. In some embodiments, the eighth active layer 80 extends along the second direction Y, and the shape of the eighth active layer 80 may be dumbbell-shaped.

In the second direction Y, the second semiconductor layer of any two adjacent columns of sub-pixels has a mirror symmetrical structure.

In some embodiments, the second semiconductor layer may use an oxide, that is, the eighth transistor is an oxide thin film transistor.

Figure 19:
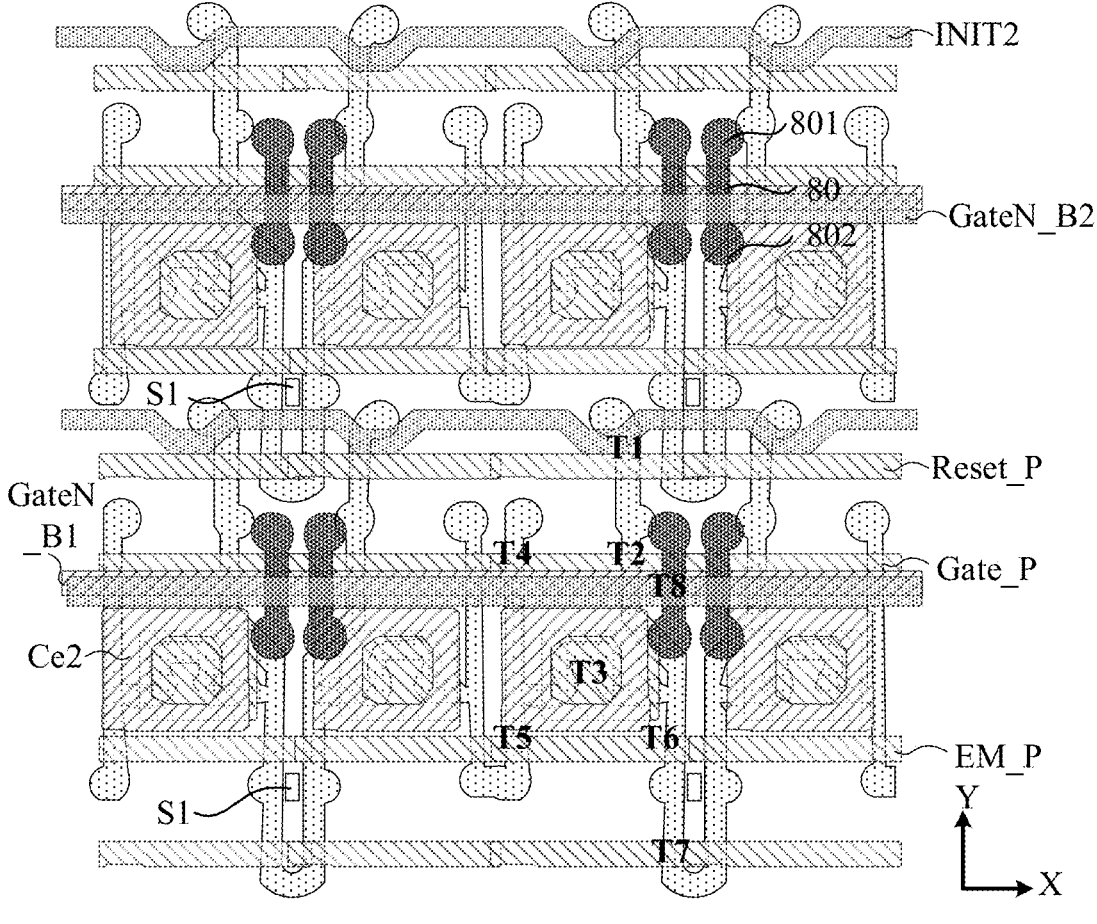

For example, FIG. 19 is a plan view illustrating a third conductive layer being laminated after the second conductive layer. As shown in FIG. 19, the third conductive layer includes: a second branch GateN_B2 of the second scanning signal line GateN and the second initial signal line INIT2. In some embodiments, the third conductive layer may be referred to as a third gate metal (GATE3) layer.

In some embodiments, in the second direction Y, the third conductive layer of any two adjacent columns of sub-pixels has a mirror symmetrical structure.

In some embodiments, the second branch GateN_B2 of the second scanning signal line GateN extends along the first direction X, and the second branch GateN_B2 of the second scanning signal line GateN is close to the second branch Gate_B2 of the first scanning signal line Gate. In some embodiments, the region where the second branch GateN_B2 of the second scanning signal line GateN overlaps with the eighth active layer 80 serves as the gate electrode of the eighth transistor.

In some embodiments, the orthographic projection of the second branch GateN_B2 of the second scanning signal line on the base substrate 110 is overlapped with the orthographic projection of the first branch GateN_B1 of the second scanning signal line on the base substrate 110. In some embodiments, the first branch GateN_B1 of the second scanning signal line and the second branch GateN_B2 of the second scanning signal line may be connected by signal lines in the periphery area.

In some embodiments, the second initial signal line INIT2 extends along the first direction X, and in each row of sub-pixels, the second initial signal line INIT2 is disposed at a side of the reset control signal line Reset_P away from the first scanning signal line Gate_P.

For example, the orthographic projection of the third light transmission opening S1 on the base substrate 110 is also located between the orthographic projection of the light-emitting control signal line EM_P on the base substrate 110 and the orthographic projection of one second initial signal line INIT2 closest to the light-emitting control signal line EM_P on the base substrate 110. Accordingly, the orthographic projection of the second light transmission opening BM2 on the base substrate 110 is also located between the orthographic projection of the light-emitting control signal line EM_P on the base substrate 110 and the orthographic projection of one second initial signal line INIT2 closest to the light-emitting control signal line EM_P on the base substrate 110.

Figure 20:
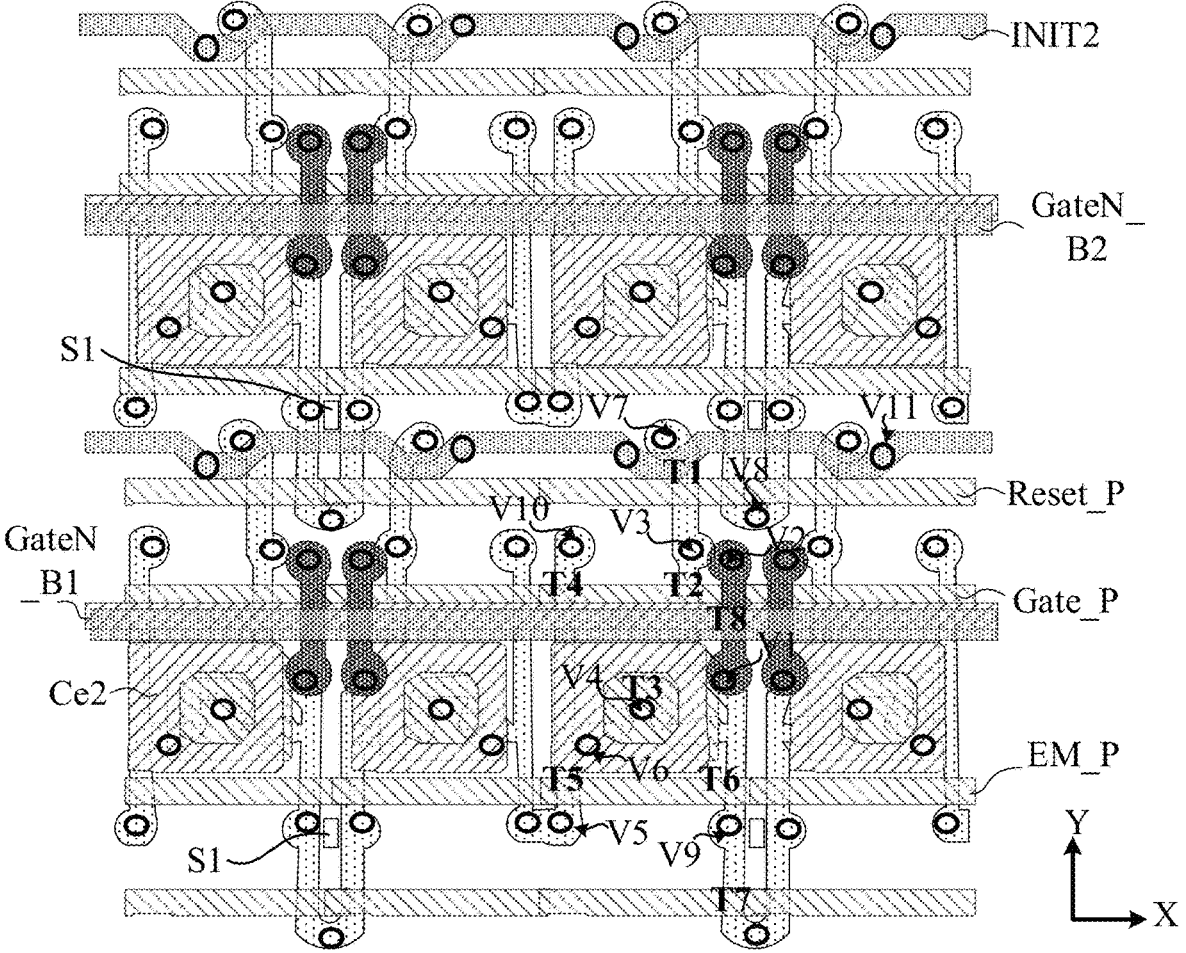

For example, FIG. 20 is a plane view illustrating a distribution of a plurality of vias in the insulation layer formed on the third conductive layer. As shown in FIG. 20, a plurality of vias are disposed in the insulation layer, the plurality of vias include a first via V1, a second via V2, a third via V3, a fourth via V4, a fifth via V5, a sixth via V6, a seventh via V7, an eighth via V8, a ninth via V9, a tenth via V10 and an eleventh via V11.

For example, the first via V1 exposes a surface of a second region of the eighth active layer 80. The second via exposes a surface of a first region of the eighth active layer 80. The third via V3 exposes a surface of a first region of the second active layer. The third via V3 is configured such that a subsequently formed first electrode of the second transistor T2 is connected to the second active layer through the via.

The fourth via V4 is located within the opening H of the second electrode plate Ce2, the orthographic projection of the fourth via V4 on the base substrate 110 is within the range of the orthographic projection of the opening H on the base substrate 110, and the fourth via V4 exposes a surface of the first electrode plate Ce1. The fourth via V4 is configured to connect a subsequently formed third connecting electrode 43 to the first electrode plate Ce1 through the via.

The fifth via V5 exposes a surface of a first region of the fifth active layer. The fifth via V5 is configured to connect a subsequently formed first electrode of the fifth transistor T5 to the fifth active layer through the via.

The sixth via V6 is located in a region where the second electrode plate Ce2 is located. The orthographic projection of the sixth via V6 on the base substrate 110 is within the range of the orthographic projection of the second electrode plate Ce2 on the base substrate 110. The sixth insulation layer, the fifth insulation layer and the fourth insulation layer within the sixth via V6 are etched to expose the surface of the second electrode plate Ce2. The sixth via V6 is configured to connect the subsequently formed fifth connecting electrode 45 to the second electrode plate Ce2 through the via.

The seventh via V7 exposes a surface of a first region of the first active layer. The seventh via V7 is configured to connect the subsequently formed first electrode of the first transistor T1 to the first active layer through the via. The eighth via V8 exposes a surface of a first region of the seventh active layer. The eighth via V8 is configured to connect the subsequently formed first initial signal line to the seventh active layer through the via. The ninth via V9 exposes a surface of a second region of the sixth active layer. The ninth via V9 is configured to connect the subsequently formed second electrode of the sixth transistor T6 to the sixth active layer through the via, and connect the subsequently formed second electrode of the seventh transistor T7 to the seventh active layer through the via.

The tenth via V10 exposes a surface of a first region of the fourth active layer. The tenth via V10 is configured to connect the subsequently formed second connecting electrode 42 to the fourth active layer through the via. The eleventh via V11 exposes a surface of the second initial signal line INIT2. The eleventh via V11 is configured to connect the subsequently formed sixth connecting electrode 46 to the second initial signal line INIT2 through the via.

Figure 21:
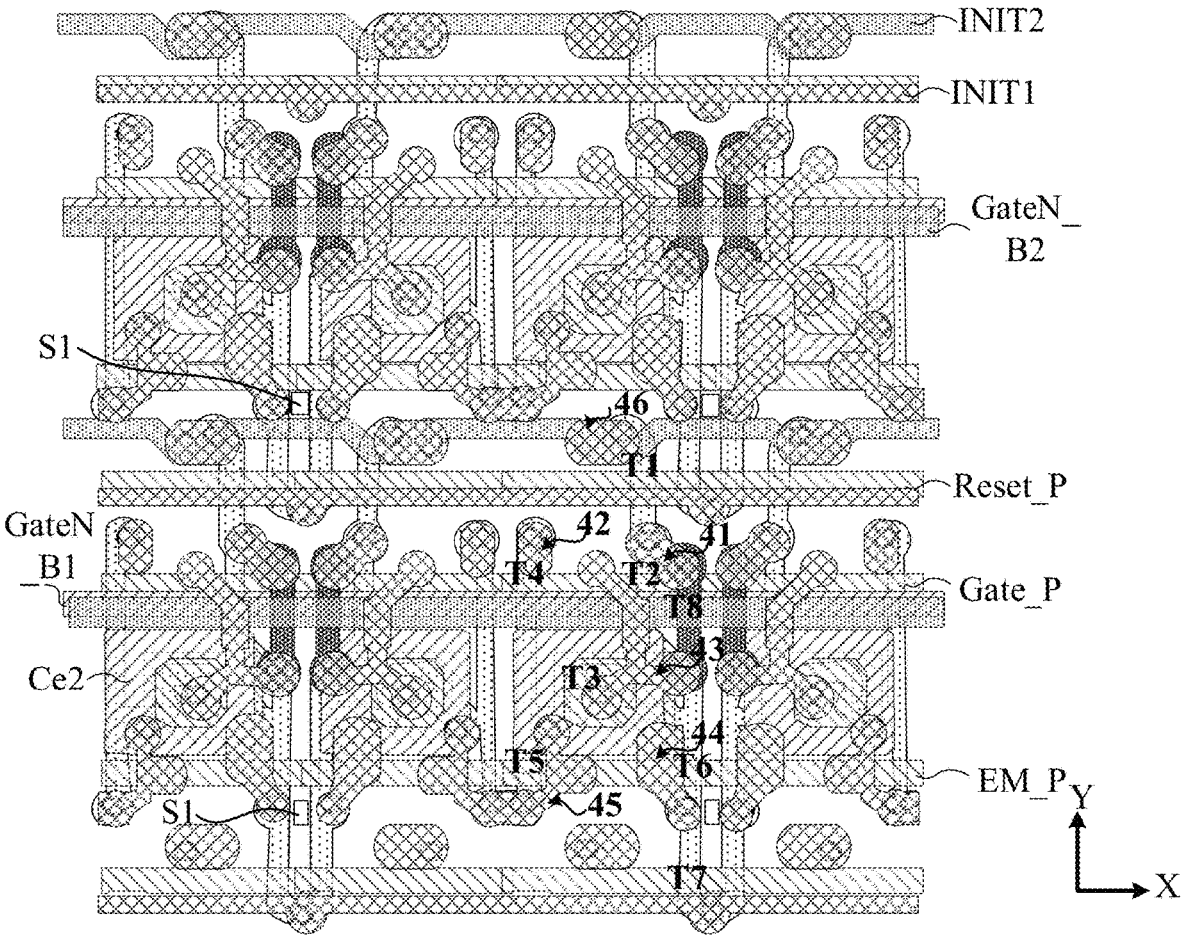

FIG. 21 illustrates a schematic plan view of a fourth conductive layer being laminated after the third conductive layer. As shown in FIG. 21, the fourth conductive layer includes: a first initial signal line INIT1, a first connecting electrode 41, a second connecting electrode 42, a third connecting electrode 43, a fourth connecting electrode 44, a fifth connecting electrode 45 and a sixth connecting electrode 46. In some embodiments, the fourth conductive layer may be referred to as a first source/drain metal (SD1) layer.

In some embodiments, in the second direction Y, the fourth conductive layer of any two adjacent columns of sub-pixels has a mirror symmetrical structure.

In some embodiments, the first initial signal line INIT1 extends along the first direction X, and the first initial signal line INIT1 is connected to the first region of the seventh active layer through the eighth via V8, so that the first electrode of the seventh transistor T7 has the same electrical potential as the first initial signal line INIT1.

In some embodiments, one end of the first connecting electrode 41 is connected to the first region of the second active layer (which is also the second region of the first active layer) through the third via V3, and the other one end of the first connecting electrode 41 is connected to the first region of the eighth active layer through the second via V2. In some embodiments, the first connecting electrode 41 may be used as the first electrode of the eighth transistor T8, the first electrode of the second transistor, and the second electrode of the first transistor.

In some embodiments, the second connecting electrode 42 is connected to the first region of the fourth active layer through the tenth via V10 on the one hand, and connected to a subsequently formed data signal line Data through a subsequently formed thirteenth via V13 on the other hand. In some embodiments, the second connecting electrode 42 may be used as the first electrode of the fourth transistor T4.

In some embodiments, one end of the third connecting electrode 43 is connected to the second region of the eighth active layer through the first via V1, and the other one end of the third connecting electrode 43 is connected to the first electrode plate Ce1 through the fourth via V4. In some embodiments, the third connecting electrode 43 may be used as the second electrode of the eighth transistor T8.

In some embodiments, the fourth connecting electrode 44 is connected to the second region of the sixth active layer (which is also the second region of the seventh active layer) through the ninth via V9 on the one hand, and connected to a subsequently formed first electrode connecting electrode through a subsequently formed twelfth via V12 on the other hand. In some embodiments, the fourth connecting electrode 44 can simultaneously serve as the second electrode of the sixth transistor T6 and the second electrode of the seventh transistor T7.

In some embodiments, the fifth connecting electrode 45 (power connecting electrode) is connected to the second electrode plate Ce2 through the sixth via V6 on the one hand, and connected to the first region of the fifth active layer through the fifth via V5 on the other hand. The fifth connecting electrode 45 is configured to connect to a subsequently formed first power line VDD through a subsequently formed fourteenth via V14.

In some embodiments, one end of the sixth connecting electrode 46 is connected to the first region of the first active layer through the seventh via V7, and the other one end of the sixth connecting electrode 46 is connected to the second initial signal line through the eleventh via V11, so that the first electrode of the first transistor T1 has the same electrical potential as the second initial signal line INIT2.

Figure 22:
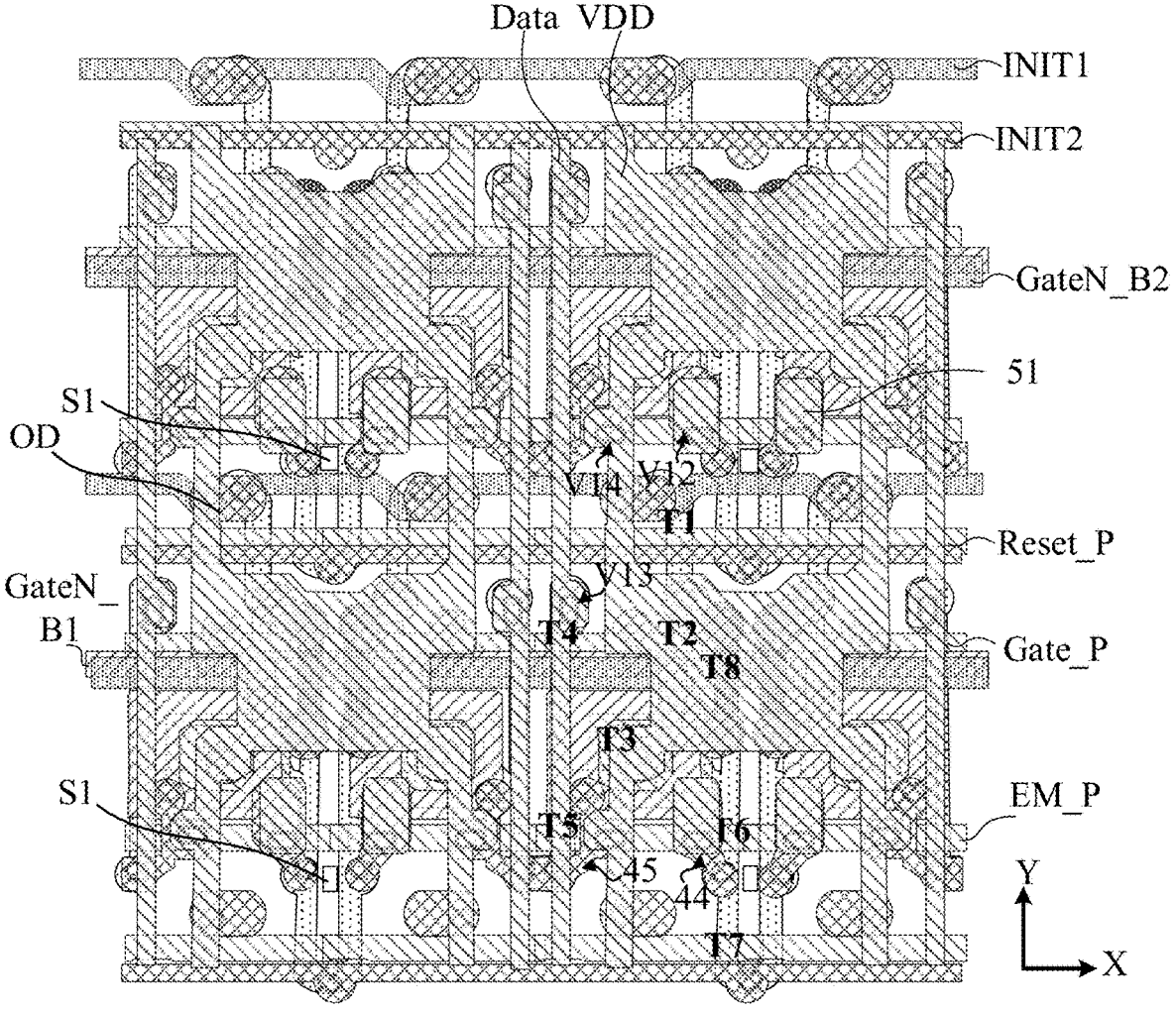

FIG. 22 illustrates a plan view of a first planarization layer being laminated after the fourth conductive layer and a fifth conductive layer being laminated after the first planarization layer. In some embodiments, as shown in FIG. 22, the first planarization layer 97 includes: the twelfth via V12, the thirteenth via V13 and the fourteenth via V14, and the fifth conductive layer includes: the data signal line Data, the first power line VDD and the first electrode connecting electrode 51. In some embodiments, the fifth conductive layer may be referred to as a second source/drain metal (SD2) layer.

In some embodiments, in the second direction Y, the fifth conductive layer of any two adjacent columns of sub-pixels has a mirror symmetrical structure. In other exemplary embodiments, in the second direction Y, the fifth conductive layer of any two adjacent columns of sub-pixels may also have no mirror symmetrical structure, and the area of the second source/drain metal layer below the second opening or the third opening may be increased as needed to increase the flatness of the first electrode (anode) that is formed at the upper layer, so that the sub-pixel is located on one plane as a whole, thereby reducing color deviation and improving display quality.

In some embodiments, as shown in FIG. 22, in a repeating unit, the first power lines VDD in two adjacent sub-pixels may be parts of an integrated structure connected to each other. By making the first power lines VDD in two adjacent sub-pixels form an interconnected integrated structure, the anode that is formed in the upper layer can be more flat.

For example, the driving circuit layer includes third signal lines (for example, the above-described first power lines VDD) that are disposed in parallel with each other and disposed periodically. The third signal lines extend in the second direction Y and intersect with the first signal lines and the second signal lines respectively. The third signal lines are configured to provide power signals to the plurality of sub-pixels. As shown in FIG. 18, the third signal line includes a hollow part OD, the orthographic projection of the third light transmission opening S1 on the base substrate 110 is located within the orthographic projection of the hollow part OD on the base substrate 110. Accordingly, the orthographic projection of the second light transmission opening BM2 on the base substrate 110 is located within the orthographic projection of the hollow part OD1 on the base substrate 110.

In some embodiments, the first electrode connecting electrode 51 may be in a rectangular shape, and the first electrode connecting electrode 51 is connected to the fourth connecting electrode 44 through the twelfth via V12.

In some embodiments, the first power line VDD is connected to the fifth connecting electrode 45 through the fourteenth via V14.

In some embodiments, the data signal line Data extends along the second direction Y, and the data signal line Data is connected to the second connecting electrode 42 through the thirteenth via V13. Since the second connecting electrode 42 is connected to the first region of the fourth active layer through the tenth via V10, the connection between the data signal line and the first electrode of the fourth transistor is thus realized, so that the data signal transmitted by the data signal line Data can be written into the fourth transistor.

Figure 23:
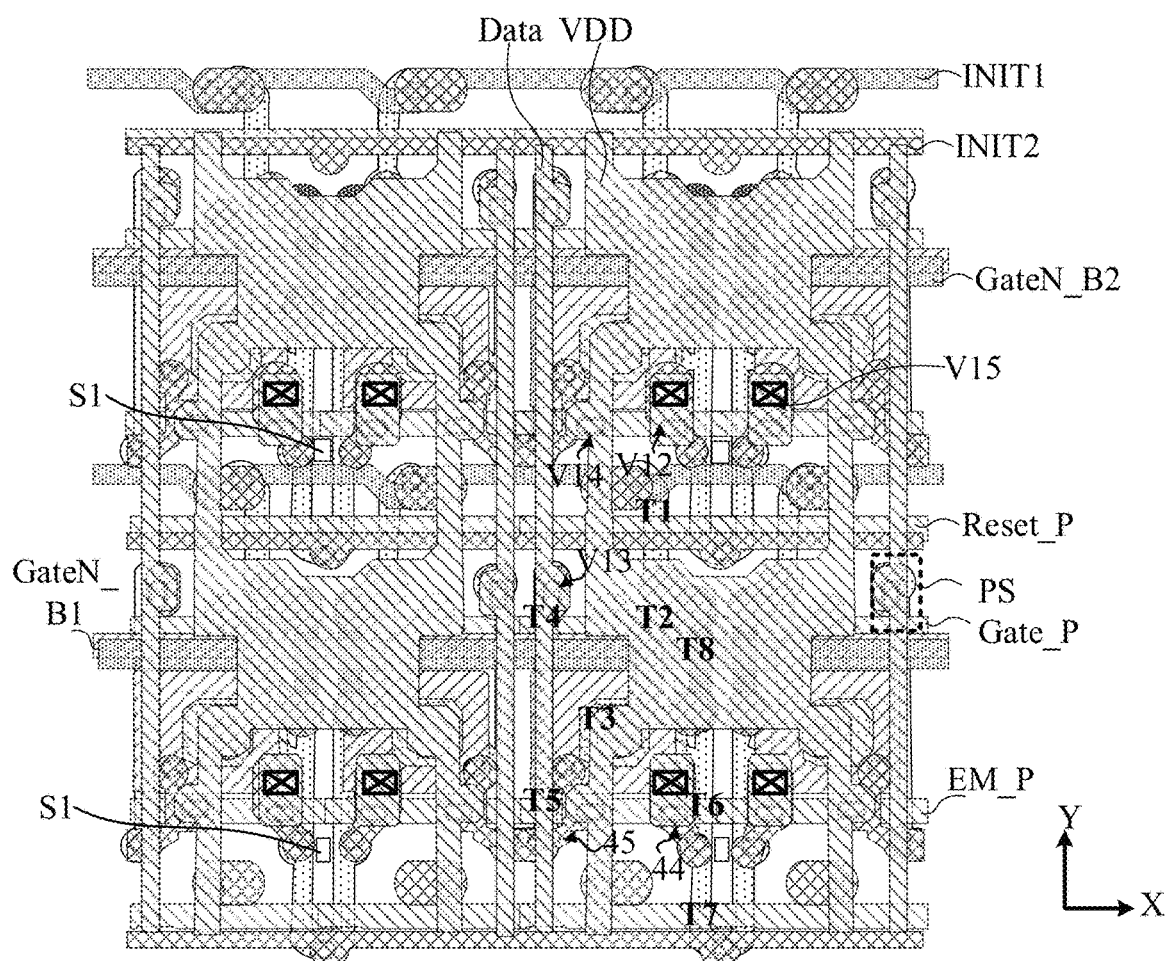

For example, FIG. 23 illustrates a plan view of the second planarization layer being laminated after the fifth conductive layer. In some embodiments, as shown in FIG. 23, the second planarization layer 98 includes a fifteenth via V15.

In some embodiments, the fifteenth via V15 is located within the region where the first electrode connecting electrode 51 is located. The second planarization layer in the fifteenth via V15 is removed and the surface of the first electrode connecting electrode 51 is exposed. The fifteenth via V15 is configured to connect the subsequently formed first electrode (e.g., an anode) to the first electrode connecting electrode 51 through the via.

Figure 24:
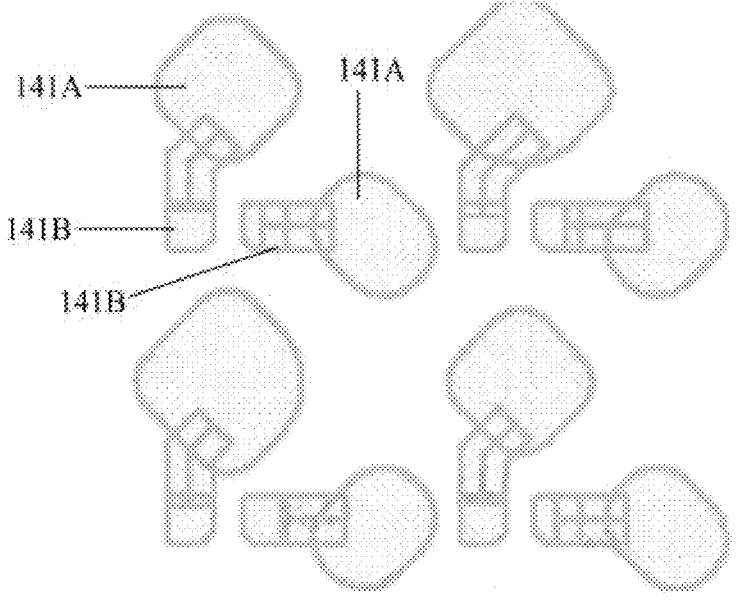

For example, in order to illustrate clearly, FIG. 24 illustrates a plan view of the first electrode layer. As shown in FIG. 24, the first electrode layer includes first electrodes 141 of a plurality of sub-pixels, and each first electrode 141 includes a body part 141A and a connection part 141B. The body part 141A is exposed by the sub-pixel opening 130, and the connection part 141B is connected to the first electrode connecting electrode 51 through the fifteenth via V15 respectively.

Since the first electrode connecting electrode 51 is connected to the fourth connecting electrode 44 through the twelfth via V12, and the fourth connecting electrode 44 is further connected to the sixth active layer through the ninth via V9, the pixel driving circuit can drive the light-emitting device to emit light.

Figure 25:
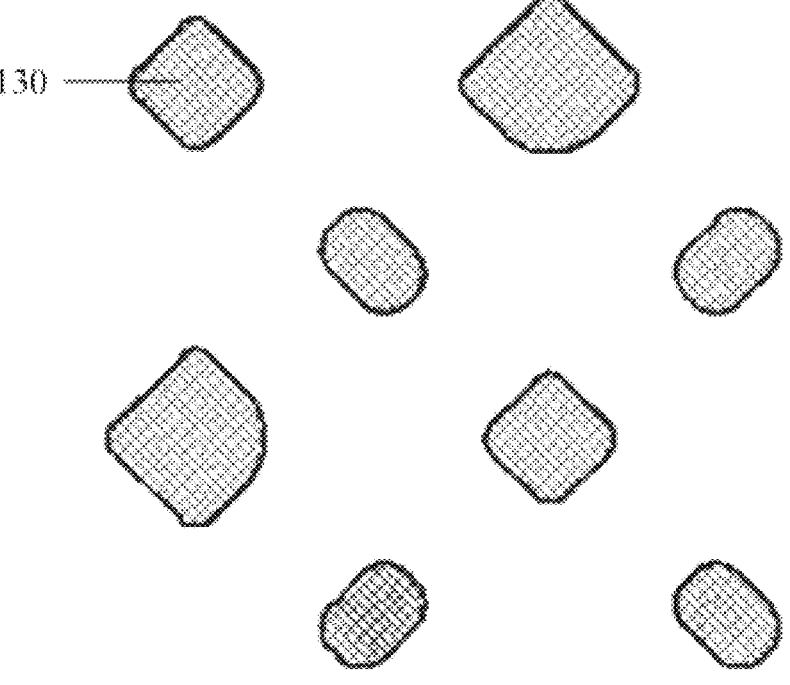

For example, FIG. 25 illustrates a plan view of the pixel definition layer PDL. As shown in FIG. 25, the pixel definition layer PDL includes a plurality of sub-pixel openings 130. The shapes of the plurality of sub-pixel openings 130 are basically the same as the shapes of the body parts 141A of the first electrodes 141, and the size of the sub-pixel opening 130 is slightly smaller than the size of the body part 141A, so as to fully expose the body part 141A.

For example, the structures and position relationships of the spacer layer 140, the touch layer FM, the black matrix layer BM and the color filter above the pixel definition layer PDL can be referred to FIG. 3, FIG. 5, FIG. 7-FIG. 9 and FIG. 11 and so on, which are not repeated here.

For example, in some embodiments, referring to FIG. 23, the pixel driving circuit layer includes a plurality of pixel driving circuit, a plurality of scanning signal lines Gate (for example, Gate_P) that provide scanning signals for the plurality of pixel driving circuits, and a plurality of reset control signal lines Reset (for example, Reset_P) that provide reset control signals for the plurality of pixel driving circuits. In the direction parallel to the base substrate, at least part of the plurality of spacers PS are respectively located between one reset control signal line Reset (for example, Reset_P) and one scanning signal line Gate (for example, Gate_P) closest to the reset control signal line Reset; for example, the above-described reset control signal line Reset and the scanning signal line Gate closest to the above-described reset control signal line Reset are used to provide electrical signals for the pixel driving circuits in the same row.

Alternatively, in some other embodiments, since the large sizes or alignment difference of the spacers PS, in the direction perpendicular to the base substrate, at least part of the the plurality of spacers PS respectively overlap with at least one of one reset control signal line Reset (for example, Reset_P) and one scanning signal line Gate (for example, Gate_P) closest to the one reset control signal line, such as being overlapped with the scanning signal line Gate (for example, Gate_P) as shown in the drawing, and in other embodiments, may also overlap with the reset control signal line Reset (for example, Reset_P), or overlap with both of the above-described reset control signal line Reset and scanning signal line Gate. In this case, at least part of the structure of the spacer PS is located between the above described one reset control signal line Reset (for example, Reset_P) and one scanning signal line Gate closest to the reset control signal line.

In the embodiments of the present disclosure, the base substrate 110 may be a flexible base substrate or a rigid base substrate. The rigid base substrate may be but not limited to one or more of glass and quartz, and the flexible base substrate may be but not limited to one or more of polyethylene terephthalate, ethylene terephthalate, polyetherether-ketone, polystyrene, polycarbonate, polyarylate, polyarylester, polyimide, polyvinyl chloride, polyethylene, textile fiber. In some embodiments, the flexible base substrate may include a first flexible material layer, a first inorganic material layer, a semiconductor layer, a second flexible material layer and a second inorganic material layer that are laminated, and the materials of the first flexible material layer and the second flexible material layer may be polyimide (PI), polyethylene terephthalate (PET) or surface-treated polymer soft film and so on. The materials of the first inorganic material layer and the second inorganic material layer may adopt silicon nitride (SiNx) or silicon oxide (SiOx), etc. so as to improve the water and oxygen resistance of the base substrate. The material of the semiconductor layer may be amorphous silicon (a-si).

For example, the first conductive layer, the second conductive layer, the third conductive layer, the fourth conductive layer and the fifth conductive layer may each use a metal material such as any one or more of silver (Ag), copper (Cu), aluminum (Al), titanium (Ti) and molybdenum (Mo), or alloy materials of above metals, such as aluminum neodymium alloy (AlNd) or molybdenum niobium alloy (MoNb), which may be single-layer structure, or multi-layer composite structure such as Mo/Cu/Mo, etc. The insulation layer may be any one or more of silicon oxide (SiOx), silicon nitride (SiNx) and silicon oxynitride (SiON), which may be a single layer, multi-layers or composite layers. The planarization layer may be made of an organic material, and a plurality of lines TL of the touch layer FM may adopt metal oxide materials such as indium tin oxide (ITO) or indium zinc oxide (IZO). The first semiconductor layer may use polycrystalline silicon (p-Si), and the second semiconductor layer (SML2) may use an oxide.

The laminated structure of the display substrate provided by the embodiments of the present disclosure is merely for exemplary illustration. In some embodiments, the corresponding structure can be changed and patterning processes may be increased or decreased according to actual needs, which are not limited in the embodiments of the present disclosure.

At least one embodiment of the present disclosure further provides a display device, which includes the display substrate provided by the embodiments of the present disclosure. The display device may be any product or component with display function, such as mobile phone, tablet computer, TV, monitor, laptop computer, digital photo frame, navigator, etc.

The following statements should be noted: (1) the accompanying drawings of the disclosed embodiments only relate to the structures related to the disclosed embodiment, and other structures can refer to the usual design. (2) For clarity, in the drawings for describing the embodiments disclosed herein, the thicknesses of the layers or regions may be enlarged or decreased, that is, these drawings are not drawn to actual scale. It should be understood that, in the case that an element such as a layer, a film, a region, or a substrate is referred to as being located "on" or "below" another element, the element may be "directly" located "on" or "below" another element, or there may be an intermediate element. (3) in case of no conflict, features in one embodiment or in different embodiments of the present disclosure can be combined.

The above, are only specific embodiments of the present disclosure, but the scope of protection of the present disclosure is not limited thereto, the scope of protection of the present disclosure shall be defined by the scope of protection of the claims.

What is claimed is:

1. A display substrate, having a plurality of sub-pixels, and comprising:

a base substrate, a pixel driving circuit layer, disposed on the base substrate, a pixel definition layer, disposed on a side of the pixel driving circuit layer away from the base substrate, and comprising a plurality of sub-pixel openings, wherein each of the plurality of sub-pixels comprises a pixel driving circuit disposed in the pixel driving circuit layer and a light-emitting device at least partially disposed in the sub-pixel opening, and a spacer layer, disposed on a side of the pixel definition layer away from the base substrate, and comprising a plurality of spacers, wherein a transmittance of the plurality of spacers is less than 5%, wherein in a direction perpendicular to the base substrate, a height of a surface of the spacer layer relative to the base substrate is greater than a height of a surface of the pixel definition layer relative to the base substrate, wherein the pixel driving circuit layer comprises a plurality of pixel driving circuits, a plurality of scanning signal lines providing scanning signals for the plurality of pixel driving circuits, and a plurality of reset control signal lines providing reset control signals for the plurality of pixel driving circuits, in a direction parallel to the base substrate, at least parts of the plurality of spacers are respectively located between one reset control signal line and one scanning signal line that is closest to the one reset control signal line, or in a direction perpendicular to the base substrate, at least parts of the plurality of spacers are respectively overlapped with at least one of one reset control signal line and one scanning signal line that is closest to the one reset control signal line.

2. The display substrate according to claim 1, wherein a transmittance of a portion of the pixel definition layer other than the plurality of sub-pixel openings is less than 5%.

3. The display substrate according to claim 1, wherein a material of the spacer layer is the same as a material of the pixel definition layer.

4. The display substrate according to claim 1, wherein a minimum distance between the plurality of spacers and the plurality of sub-pixel openings is L, and $1 \ \mu m < L < 8 \ \mu m$.

5. The display substrate according to claim 1, further comprising a black matrix layer, disposed on a side of the light-emitting device away from the base substrate, wherein the black matrix layer comprises a plurality of first light transmission openings, orthographic projections of the plurality of sub-pixel openings on the base substrate are respectively located within orthographic projections of the plurality of first light transmission openings on the base substrate, and distances between boundaries of the orthographic projections of the plurality of sub-pixel openings on the base substrate and boundaries of the orthographic projections of the plurality of first light transmission openings on the base substrate are in a range of $1.0 \ \mu m$ to $6.5 \ \mu m$.

6. The display substrate according to claim 5, further comprising a plurality of color filters, wherein the plurality of color filters are respectively at least partially disposed in the plurality of first light transmission openings;

for one first light transmission opening and one color filter that is at least partially disposed in the one first light transmission opening, an orthographic projection of the one first light transmission opening on the base substrate is located within an orthographic projection of the one color filter on the base substrate.

7. The display substrate according to claim 6, wherein the black matrix layer further comprises a plurality of second light transmission openings, and the plurality of second light transmission openings are respectively disposed between two adjacent first light transmission openings among the plurality of first light transmission openings.

8. The display substrate according to claim 7, further comprising a light shielding layer disposed on the base substrate, wherein the pixel driving circuit layer is disposed on a side of the light shielding layer away from the base substrate, and the light shielding layer comprises a plurality of third light transmission openings, orthographic projections of at least parts of the plurality of third light transmission openings on the base substrate are respectively at least partially overlapped with orthographic projections of the plurality of second light transmission openings on the base substrate.

9. The display substrate according to claim 8, wherein the orthographic projections of the plurality of third light transmission openings on the base substrate are respectively located within the orthographic projections of the plurality of second light transmission openings on the base substrate.

10. The display substrate according to claim 8, wherein the plurality of sub-pixels comprise first sub-pixels, second sub-pixels and third sub-pixels, at least part of the plurality of second light transmission openings is located between first light transmission openings corresponding to a first sub-pixel and a third sub-pixel that are adjacent to each other, and a distance between the at least part of the plurality of second light transmission opening and the first light transmission opening corresponding to the first sub-pixel is different from a distance between the at least part of the plurality of second light transmission opening and the first light transmission opening corresponding to the third sub-pixel.

11. The display substrate according to claim 10, wherein the first sub-pixels and the third sub-pixels are arranged in a plurality of rows and a plurality of columns, a plurality of first sub-pixels and a plurality of third sub-pixels in a same column are arranged alternately, and one second light transmission opening is disposed between first light transmission openings corresponding to a first sub-pixel and a third sub-pixel that are adjacent to each other in a same column.

12. The display substrate according to claim 11, wherein one first sub-pixel, two second sub-pixels and one third sub-pixel constitute a repeating unit, and a plurality of repeating units are arranged in an array, a plurality of second sub-pixels in the plurality of repeating units are arranged in a plurality of rows and a plurality of columns, and the one second light transmission opening is also disposed between first light transmission openings corresponding to second sub-pixels that are adjacent in a row direction.

13. The display substrate according to claim 12, wherein an orthographic projection of each of the plurality of spacers on the base substrate is located between orthographic projections of sub-pixel openings of second sub-pixels that are adjacent in a column direction, and is located between orthographic projections of sub-pixel openings of a first sub-pixel and a third sub-pixel that are adjacent in the row direction on the base substrate.

14. The display substrate according to claim 13, wherein a shortest distance between the orthographic projection of each of the plurality of spacers on the base substrate and the orthographic projection of the sub-pixel opening of the first sub-pixel among the first sub-pixel and the third sub-pixel that are adjacent to each other on the base substrate is greater than a shortest distance between the orthographic projection of each of the plurality of spacers on the base substrate and the orthographic projection of the sub-pixel opening of the third sub-pixel among the first sub-pixel and the third sub-pixel that are adjacent to each other on the base substrate.

15. The display substrate according to claim 14, wherein shortest distances between the orthographic projection of each of the plurality of spacers on the base substrate and the orthographic projections of the sub-pixel openings of the second sub-pixels that are adjacent to each other on the base substrate are substantially the same.

16. The display substrate according to claim 7, further comprising an encapsulation layer disposed on a side of the light-emitting device away from the base substrate and a touch layer disposed on a side of the encapsulation layer away from the base substrate, wherein the black matrix layer is disposed on a side of the encapsulation layer away from the base substrate, the black matrix layer is disposed on a side of the touch layer away from the base substrate, and the touch layer comprises a plurality of touch lines, orthographic projections of the plurality of touch lines on the base substrate are not overlapped with orthographic projections of the plurality of second light transmission openings on the base substrate.

17. The display substrate according to claim 16, wherein the first sub-pixels and the third sub-pixels are arranged in a plurality of rows and a plurality of columns, a plurality of first sub-pixels and a plurality of third sub-pixels in a same column are arranged alternately, wherein at least a part of the plurality of touch lines has a gap between a first sub-pixel and a third sub-pixel that are adjacent in a same column.

18. The display substrate according to claim 17, wherein at least a part of the plurality of touch lines has a gap at a side close to the third sub-pixel or a side close to the first sub-pixel among the first sub-pixel and the third sub-pixel that are adjacent in a same column; or at least a part of the plurality of touch lines has a gap at a side close to the third sub-pixel and a side close to the first sub-pixel among the first sub-pixel and the third sub-pixel that are adjacent in a same column.

19. A display device, comprising the display substrate according to claim 1.

* * * * *